(12) United States Patent
Suzuki et al.

(10) Patent No.: US 12,175,050 B2
(45) Date of Patent: Dec. 24, 2024

(54) METHOD OF MANUFACTURING CONDUCTIVE MEMBER FOR TOUCH PANEL AND CONDUCTIVE MEMBER FOR TOUCH PANEL

(71) Applicant: FUJIFILM Corporation, Tokyo (JP)

(72) Inventors: Takato Suzuki, Kanagawa (JP); Tetsuro Mitsui, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 56 days.

(21) Appl. No.: 18/188,921

(22) Filed: Mar. 23, 2023

(65) Prior Publication Data

US 2023/0229276 A1 Jul. 20, 2023

Related U.S. Application Data

(63) Continuation of application No. PCT/JP2021/035527, filed on Sep. 28, 2021.

(30) Foreign Application Priority Data

Sep. 30, 2020 (JP) .................................. 2020-165317
Sep. 16, 2021 (JP) .................................. 2021-151218

(51) Int. Cl.
  *G06F 3/044* (2006.01)
  *G03F 7/00* (2006.01)
  *H05K 1/03* (2006.01)

(52) U.S. Cl.
  CPC .......... *G06F 3/0446* (2019.05); *G03F 7/0035* (2013.01); *G06F 3/0445* (2019.05);
  (Continued)

(58) Field of Classification Search
  CPC .................. G06F 3/0446; G06F 3/0445; G06F 2203/04102; G06F 2203/04103; G03F 7/0035; H05K 1/0353; H05K 2201/0145
  See application file for complete search history.

(56) References Cited

U.S. PATENT DOCUMENTS

2011/0216029 A1* 9/2011 Jin .......................... C08J 7/123
  345/173
2014/0333855 A1 11/2014 Park et al.
(Continued)

FOREIGN PATENT DOCUMENTS

CN  110794992 A  2/2020
JP  2011-174006 A  9/2011
(Continued)

OTHER PUBLICATIONS

International Search Report issued in PCT/JP2021/035527 on Dec. 28, 2021.

(Continued)

*Primary Examiner* — Afroza Chowdhury
(74) *Attorney, Agent, or Firm* — Edwards Neils LLC; Jean C. Edwards, Esq.

(57) ABSTRACT

Provided are a conductive member for a touch panel and a manufacturing method thereof, the conductive member having a conductive layer including an opaque conductive material on a flexible transparent insulating substrate, such that damage of the conductive layer is prevented. The manufacturing method of the conductive member including a first conductive layer, an interlayer insulating layer, and a second conductive layer in this order on the flexible substrate, includes: 1) forming the first conductive layer on the substrate; 2) forming the interlayer insulating layer; and 3) forming the second conductive layer, in which each of the steps 1 and 3 includes forming a fine metal wire using a photolithography method, a thickness of the interlayer insulating layer is 1 to 5 μm, and the bend resistance obtained by measuring the conductive member using a cylindrical mandrel method according to JIS-K5600-5-1 is less than 5 mm.

9 Claims, 2 Drawing Sheets

(52) U.S. Cl.
CPC .............. *G06F 2203/04102* (2013.01); *G06F 2203/04103* (2013.01); *H05K 1/0353* (2013.01); *H05K 2201/0145* (2013.01)

(56) References Cited

U.S. PATENT DOCUMENTS

| | | | |
|---|---|---|---|
| 2015/0145824 A1 | 5/2015 | Park et al. | |
| 2018/0046287 A1 | 2/2018 | Wada et al. | |
| 2019/0377457 A1 | 12/2019 | Nakayama et al. | |
| 2020/0064973 A1 | 2/2020 | Mitsui et al. | |
| 2020/0194506 A1* | 6/2020 | Li | H10K 59/40 |
| 2020/0241701 A1 | 7/2020 | Nakayama | |

FOREIGN PATENT DOCUMENTS

| | | |
|---|---|---|
| JP | 2014-010325 A | 1/2014 |
| JP | 2014-219987 A | 11/2014 |
| JP | 2015-072626 A | 4/2015 |
| JP | 2015-103254 A | 6/2015 |
| JP | 2016-118917 A | 6/2016 |
| JP | 2016-207041 A | 12/2016 |
| JP | 2016-224631 A | 12/2016 |
| JP | 2017-054926 A | 3/2017 |
| JP | 2018-097297 A | 6/2018 |
| JP | 2018-187914 A | 11/2018 |
| JP | 2019-001134 A | 1/2019 |
| JP | 2019-033007 A | 2/2019 |
| JP | 2019-034253 A | 3/2019 |
| JP | 2019-105829 A | 6/2019 |
| JP | 2019-140389 A | 8/2019 |
| JP | 2019-151059 A | 9/2019 |
| JP | 2019-179109 A | 10/2019 |
| JP | 2020-172573 A | 10/2020 |
| JP | 2021-091194 A | 6/2021 |
| WO | 2016/208293 A1 | 12/2016 |
| WO | 2018/163603 A1 | 9/2018 |
| WO | 2019/003726 A1 | 1/2019 |
| WO | 2019/093045 A1 | 5/2019 |

OTHER PUBLICATIONS

Written Opinion issued in PCT/JP2021/035527 on Dec. 28, 2021.
International Preliminary Report on Patentability Chapter II completed by WIPO on Dec. 1, 2022 in connection with International Patent Application No. PCT/JP2021/035527.
Office Action, which was issued by the Japanese Patent Office on Jan. 9, 2024, in connection with Japanese Patent Application No. 2022-553982.
Office Action, which was issued by the Japanese Patent Office on Jun. 25, 2024, in connection with Japanese Patent Application No. 2022-553982.

* cited by examiner

METHOD OF MANUFACTURING CONDUCTIVE MEMBER FOR TOUCH PANEL AND CONDUCTIVE MEMBER FOR TOUCH PANEL

CROSS-REFERENCE TO RELATED APPLICATIONS

This application is a Continuation of PCT International Application No. PCT/JP2021/035527 filed on Sep. 28, 2021, which was published under PCT Article 21(2) in Japanese, and which claims priority under 35 U.S.C. § 119(a) to Japanese Patent Application No. 2020-165317 filed on Sep. 30, 2020, and Japanese Patent Application No. 2021-151218 filed on Sep. 16, 2021. The above applications are hereby expressly incorporated by reference, in their entirety, into the present application.

BACKGROUND OF THE INVENTION

1. Field of the Invention

The present invention relates to a method of manufacturing a conductive member for a touch panel that is used as a touch sensor or an electrode of a touch panel and a conductive member for a touch panel.

2. Description of the Related Art

Recently, in various electronic apparatuses including a portable information apparatus such as a tablet computer or a smartphone, a touch panel that is used in combination with a display device such as a liquid crystal display device and performs an input operation into an electronic apparatus by allowing a finger, a stylus pen, or the like to contact or approach a screen has been widely used.

In the touch panel, a conductive member on which a detection unit for detecting a touch operation that is performed through contact or approach of a finger, a stylus pen, or the like is formed on a transparent insulating substrate is used.

The detection unit is likely to be formed of a transparent conductive oxide such as indium tin oxide (ITO) but may be formed of an opaque conductive material such as a metal other than the transparent conductive oxide. The opaque conductive material such as metal is advantageous in that, for example, patterning is easier or the resistance is lower as compared to the above-described transparent conductive oxide. Therefore, in a touch panel or the like, a detection unit that is formed of a conductive material such as copper or silver is used.

For example, CN110794992A describes a touch panel formed of an opaque conductive material that is formed on a transparent insulating substrate. In the touch panel described in CN110794992A, a glass plate is adopted as the transparent insulating substrate.

SUMMARY OF THE INVENTION

According to the invention described in CN110794992A, a touch panel formed of an opaque conductive material such as metal can be formed on a glass plate. However, it was found that, in a case where the transparent insulating substrate is changed from the glass plate to a flexible film in order to reduce the weight and to secure flexibility, a conductive layer formed of an opaque conductive material may be damaged (for example, disconnection of fine metal wires) in a manufacturing process, such that the touch panel does not function.

The present invention has been made in consideration of the above-described circumstances, and a first object thereof is to provide a method of manufacturing a conductive member for a touch panel and a conductive member for a touch panel, the conductive member including a conductive layer that includes an opaque conductive material on a transparent insulating substrate, in which even in a case where a flexible substrate is used as the transparent insulating substrate, damage of the conductive layer can be prevented and interlayer insulating properties can be secured.

In addition, a second object of the present invention is to provide a conductive member for a touch panel having excellent storage stability.

According to an aspect of the present invention, there is provided a method of manufacturing a conductive member for a touch panel, the conductive member including a first conductive layer, an interlayer insulating layer, and a second conductive layer in this order on a flexible transparent insulating substrate, in which each of a step of forming the first conductive layer and a step of forming the second conductive layer includes a step of forming a fine metal wire using a photolithography method, a thickness of the interlayer insulating layer is 1 to 5 μm, and a value of bend resistance obtained by measuring the conductive member for a touch panel in a bending resistance test using a cylindrical mandrel method according to JIS-K5600-5-1 is less than 5 mm.

In addition, according to another aspect of the present invention, there is provided a conductive member for a touch panel, the conductive member comprising a first mesh conductive layer, an interlayer insulating layer, and a second mesh conductive layer in this order on a flexible transparent insulating substrate, in which a thickness of the interlayer insulating layer is 1 to 5 μm, and a value of bend resistance obtained by measuring the conductive member for a touch panel in a bending resistance test using a cylindrical mandrel method according to JIS-K5600-5-1 is less than 5 mm.

In addition, according to still another aspect of the present invention, there is provided a conductive member for a touch panel, the conductive member comprising a first mesh conductive layer, an interlayer insulating layer, and a second mesh conductive layer in this order on a flexible transparent insulating substrate, in which in a case where a thickness (m) of the interlayer insulating layer is represented by X and a value (mm) of bend resistance obtained by measuring the conductive member for a touch panel in a bending resistance test using a cylindrical mandrel method according to JIS-K5600-5-1 is represented by Y, Y/X is 1.5 or less.

It is preferable that the interlayer insulating layer includes a polymer derived from at least one compound selected from the group consisting of a monomer and an oligomer having at least one group selected from the group consisting of an acryloyl group and a methacryloyl group, and it is preferable that a CLogP value of the compound is 6.0 or more.

It is preferable that the interlayer insulating layer includes a polymer derived from at least one compound selected from the group consisting of a monomer and an oligomer having at least one group selected from the group consisting of an acryloyl group and a methacryloyl group, and it is preferable that an acrylic equivalent of the compound is 180 or more.

It is preferable that each of the first conductive layer and the second conductive layer includes a fine metal wire having a thickness of 0.1 to 1 μm, and it is preferable that the fine metal wire includes copper.

It is preferable that the flexible transparent insulating substrate is a substrate formed of a polyester polymer, and it is preferable that a thickness of the flexible transparent insulating substrate is 10 to 60 μm.

According to the aspects of the present invention, a conductive member for a touch panel can be obtained, the conductive member including a conductive layer that includes an opaque conductive material on a transparent insulating substrate, in which even in a case where a flexible substrate is used as the transparent insulating substrate, damage of the conductive layer can be prevented and interlayer insulating properties can be secured.

In addition, according to the aspects of the present invention, a conductive member for a touch panel having excellent storage stability can be obtained.

DESCRIPTION OF THE PREFERRED EMBODIMENTS

Hereinafter, a method of manufacturing a conductive member for a touch panel and a conductive member for a touch panel according to the present invention will be described in detail based on a preferable embodiment shown in the accompanying drawings.

The drawings described below are exemplary drawings for describing the present invention, and the present invention is not limited to the drawings described below.

In the following description, a numerical range indicated by the expression "to" includes numerical values described on both sides. For example, in a case where "s is a numerical value t1 to a numerical value t2", the range s is a range including the numerical value t1 and the numerical value t2, which is expressed by a mathematical symbol t1≤s≤t2.

In addition, for example, "A/B" represents "A and B" or "A or B".

Unless specified otherwise, the meaning of an angle such as "perpendicular" or "parallel" includes a case where an error range is generally allowable in the technical field.

"Transparent" represents that a light transmittance in a visible wavelength range of 400 to 800 nm is at least 40% or more, preferably 75% or more, more preferably 80% or more, and still more preferably 90% or more. The light transmittance is measured using "Plastics—Determination of Total Luminous Transmittance and Reflectance" defined by JIS K 7375:2008.

In the present specification, "(meth)acrylate" denotes either or both of acrylate and methacrylate, "(meth)acrylic acid" denotes either or both of acrylic acid and methacrylic acid, and "(meth)acryloyl" denotes either or both of acryloyl and methacryloyl.

[Touch Panel]

Figure 1:
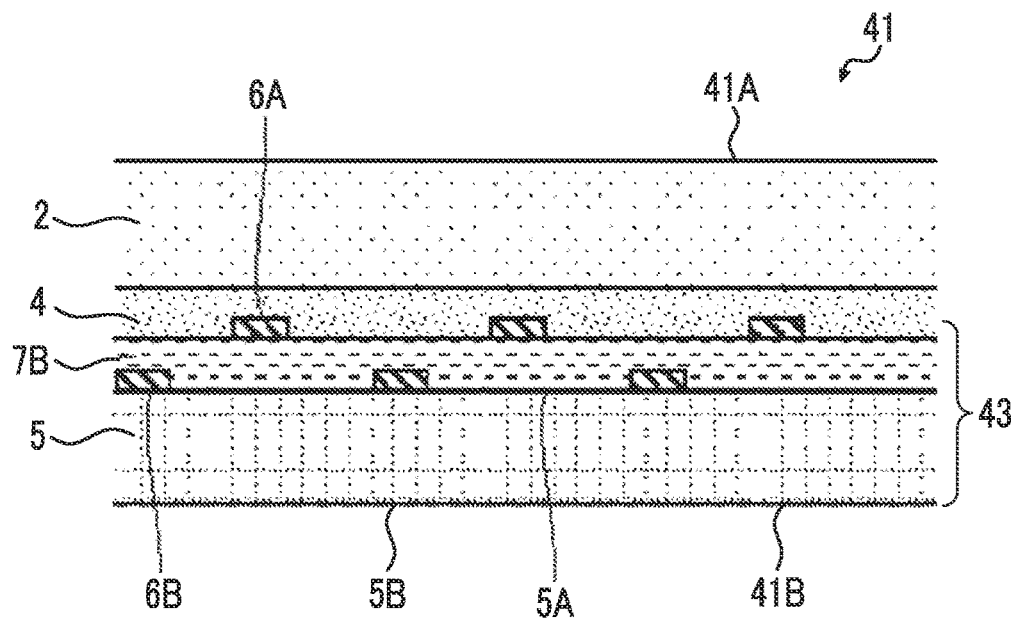
FIG. 1 is a schematic partial cross-sectional view showing an example of a touch panel formed of a conductive member for a touch panel according to an embodiment of the present invention.
Figure 2:
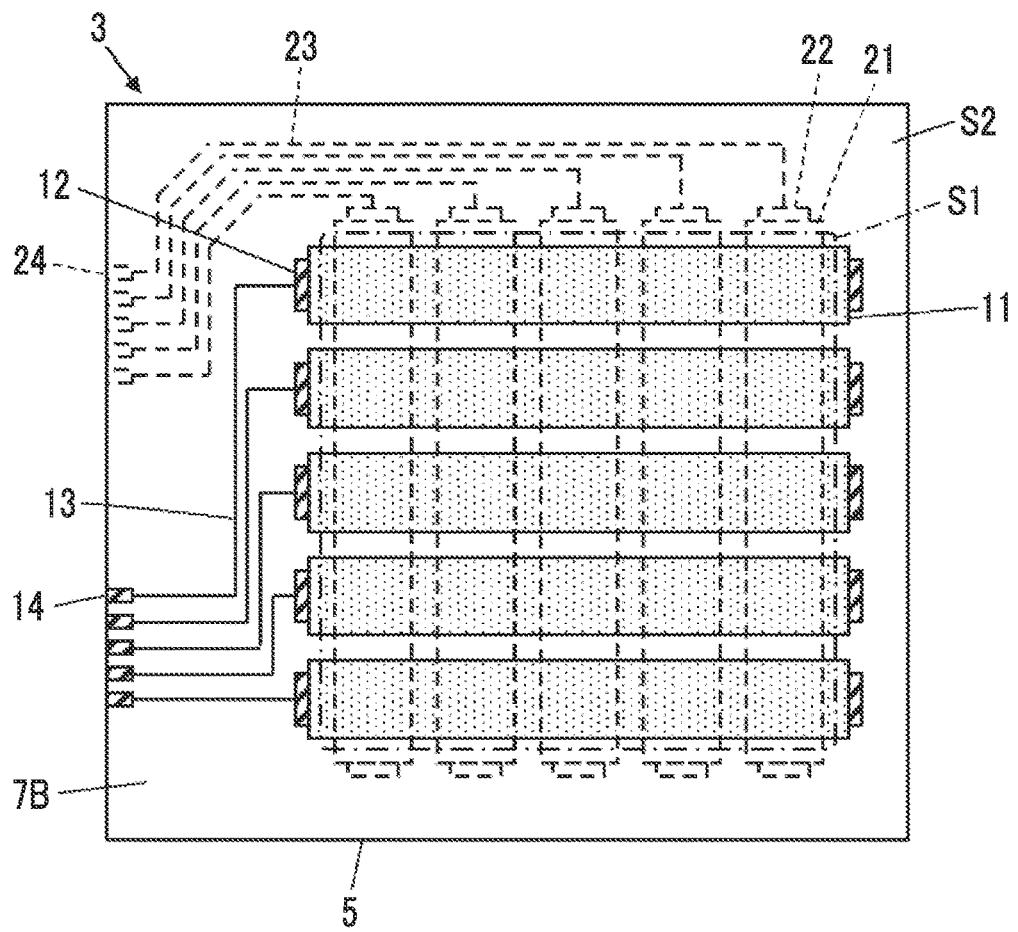
FIG. 2 is a schematic plan view showing an example of the conductive member for a touch panel according to the embodiment of the present invention.

FIG. 1 is a schematic partial cross-sectional view showing an example of a touch panel formed of a conductive member for a touch panel according to an embodiment of the present invention. FIG. 2 is a schematic plan view showing an example of the conductive member for a touch panel according to the embodiment of the present invention.

A touch panel 41 shown in FIG. 1 includes a front surface 41A and a back surface 41B, and is used in a state where a display module (not shown) is disposed on the back surface 41B side. The front surface 41A of the touch panel 41 is a touch detection surface and is a visible side surface where an operator of the touch panel 41 observes an image displayed on the display module through the touch panel 41.

The touch panel 41 includes the cover panel 2 that is disposed on the front surface 41A, and a conductive member 43 for a touch panel is bonded to a surface of the cover panel 2 opposite to the front surface 41A using a transparent adhesive layer 4.

The conductive member 43 for a touch panel shown in FIG. 1 includes: a flexible transparent insulating substrate 5; a first conductive layer 6B that is formed on a first surface 5A of the flexible transparent insulating substrate 5; an interlayer insulating layer 7B that is formed on the first conductive layer 6B; and a second conductive layer 6A that is formed on the interlayer insulating layer 7B. The first conductive layer 6B, the second conductive layer 6A, and the interlayer insulating layer 7B may be formed on a surface 5B of the flexible transparent insulating substrate 5.

In the present specification, the expression "conductive member for a touch panel" or "conductive member" refers to the conductive member for a touch panel including the flexible transparent insulating substrate, the first conductive layer, the interlayer insulating layer, and the second conductive layer.

First Embodiment

First, a conductive member for a touch panel according to a first embodiment of the present invention will be described.

The conductive member for a touch panel according to the first embodiment comprises a first mesh conductive layer, an interlayer insulating layer, and a second mesh conductive layer in this order on a flexible transparent insulating substrate, in which a thickness of the interlayer insulating layer is 1 to 5 μm, and a value of bend resistance obtained by measuring the conductive member for a touch panel in a bending resistance test using a cylindrical mandrel method according to JIS-K5600-5-1 is less than 5 mm.

In the present specification, the value of bend resistance obtained by measuring the conductive member for a touch panel in the bending resistance test using the cylindrical mandrel method will also referred to as "measured value of brittleness" of the conductive member for a touch panel.

Hereinafter, each of the members forming the conductive member 3 for a touch panel will be described with reference to FIG. 2.

The conductive member 3 for a touch panel shown in FIG. 2 is divided into: a transmission region S1 for detecting a touch operation by a finger, a stylus pen, or the like; and a peripheral region S2 that is a region outside of the transmission region S1 and is provided for disposing peripheral wires and the like through which the conductive member 3 for a touch panel is connected to a display module (not shown).

In the first conductive layer 6B and the second conductive layer 6A, electrodes for detecting the touch operation and peripheral wires and the like for connection to the electrodes are formed of metal that is patterned using a photolithography method. The first conductive layer 6B includes a plurality of first electrodes 11 that extend in a given direction and are arranged at intervals in a direction perpendicular to the extending direction. Each of the plurality of first electrodes 11 includes a first pad 12 at an end part.

In addition, the first conductive layer 6B includes: a plurality of first peripheral wires 13 led out from the plurality of first pads 12 of the plurality of first electrodes 11; and a plurality of first external connection terminals 14 that are connected to the plurality of first peripheral wires 13, respectively.

The second conductive layer 6A includes a plurality of second electrodes 21 that extend in a direction perpendicular to the direction in which the plurality of first electrodes 11 extend and are arranged at intervals in the direction in which the plurality of first electrodes 11 extend. Each of the plurality of second electrodes 21 includes a second pad 22 at an end part.

In addition, the second conductive layer 6A includes: a plurality of second peripheral wires 23 led out from the plurality of second pads 22 of the plurality of second electrodes 21; and a plurality of second external connection terminals 24 that are connected to the plurality of second peripheral wires 23, respectively.

Here, the plurality of first electrodes 11 of the first conductive layer 6B and the plurality of second electrodes 21 of the second conductive layer 6A are disposed in the transmission region S1 divided in the conductive member 3 for a touch panel.

In addition, the plurality of first pads 12, the plurality of first peripheral wires 13, and the plurality of first external connection terminals 14 of the first conductive layer 6B and the plurality of second pads 22, the plurality of second peripheral wires 23, and the plurality of second external connection terminals 24 of the second conductive layer 6A are disposed in the peripheral region S2 divided from the conductive member 3 for a touch panel.

Figure 3:
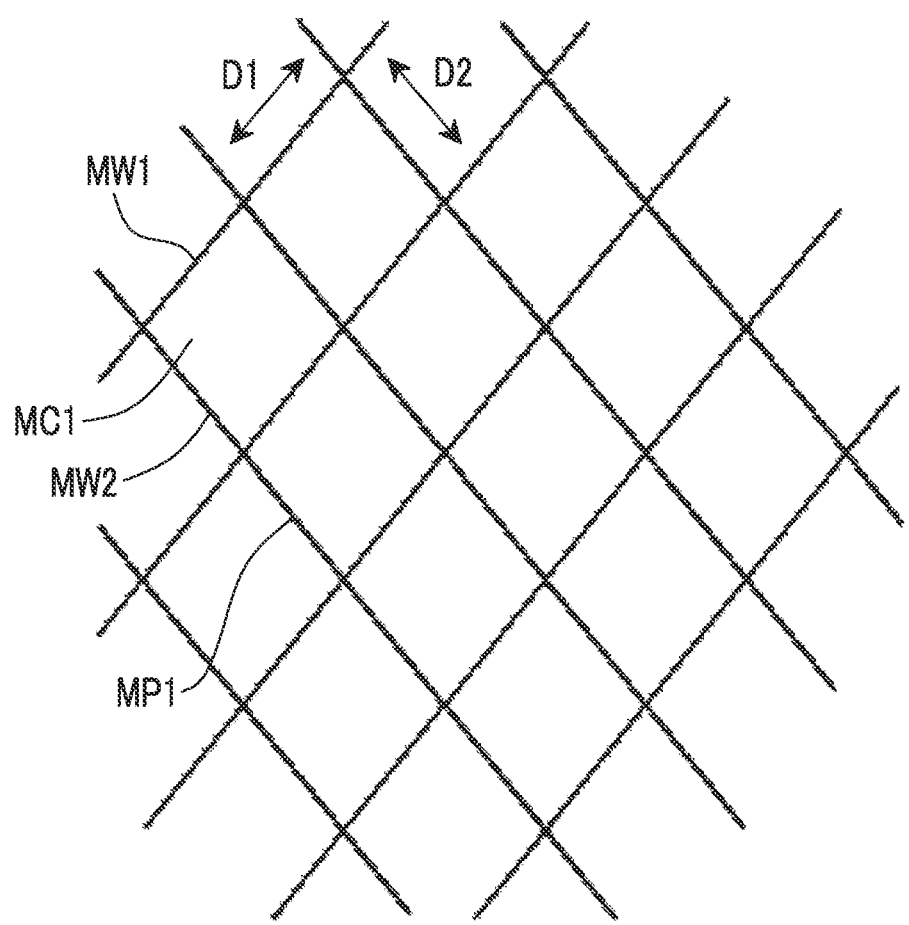
FIG. 3 is a schematic partially enlarged plan view showing an example of a first electrode according to the embodiment of the present invention.

FIG. 3 is a partially enlarged plan view showing the first electrode 11.

The first electrode 11 includes: a plurality of fine metal wires MW1 that linearly extend substantially in a first direction D1 in a plan view; and a plurality of fine metal wires MW2 that linearly extend substantially in a second direction D2 in a plan view. The first direction D1 and the second direction D2 intersect each other. In addition, the plurality of fine metal wires MW1 and the plurality of fine metal wires MW2 intersect each other to be electrically connected on the same surface such that a plurality of intersection portions where the fine metal wires MW1 and the fine metal wires MW2 intersect each other are formed. In addition, the plurality of fine metal wires MW1 and the plurality of fine metal wires MW2 intersect each other this way to form a plurality of rhombic reference mesh cells MC1, and thus a regular reference mesh pattern MP1 including the plurality of rhombic reference mesh cells MC1 is formed.

In the second electrode 21, likewise, in a plan view, the plurality of fine metal wires MW1 and the plurality of fine metal wires MW2 intersect each other this way to form a plurality of rhombic reference mesh cells MC1, and thus a regular reference mesh pattern MP1 including the plurality of rhombic reference mesh cells MC1 is formed.

In the present specification, a conductive layer having a mesh pattern in at least a part will also be referred to as "mesh conductive layer". The shape of the mesh cell in the mesh pattern of the mesh conductive layer may be another shape other than the above-described rhombic shape. The shape of the mesh cell may be, for example, a polygonal shape (for example, a triangular shape, a quadrangular shape (a square shape, a rectangular shape, or the like), a hexagonal shape, or a random polygonal shape). In addition, the shape of a side of the mesh cell may have a curved shape other than a straight line or may have an arc shape.

Between the plurality of first electrodes 11 in the transmission region S1, dummy electrodes (not shown) that are electrically connected to the plurality of first electrodes 11 and are insulated from peripheral circuits may also be provided. In addition, between the plurality of second electrodes 21 in the transmission region S1, dummy electrodes (not shown) that are electrically connected to the plurality of second electrodes 21 and are insulated from peripheral circuits may also be provided. The dummy electrodes may include the same fine metal wires as the fine metal wires MW1 and MW2 forming each of the first electrode 11 and the second electrode 21 and may have the same pattern as the mesh pattern MP1. It is preferable that, for example, a fracture portion having a width of 5 to 50 µm is formed at each of a position between the first electrode 11 and the dummy electrode and a position between the second electrode 21 and the dummy electrode. As a result, the first electrode 11 and the dummy electrode are electrically insulated from each other, and the second electrode 21 and the dummy electrode are electrically insulated from each other. In addition, in order to improve electrical insulating properties of the dummy electrodes from the peripheral circuits, an additional fracture portion may be formed in each of the dummy electrodes.

From the viewpoints of preventing the fine metal wires MW1 and MW2 from being conspicuous, maintaining the electric resistance of the first electrode 11 and the second electrode 21 at low values, and improving the detection sensitivity for the touch operation, it is preferable that the fine metal wires MW1 and MW2 forming each of the first electrode 11 and the second electrode 21 have a line width of 1 to 5 µm.

In addition, it is preferable that the touch panel has a given light transmittance or more such that an image displayed on the display module is clearly recognized in a case where the touch panel is disposed on the display module to be used as the image display apparatus. From the viewpoint, an opening ratio of the mesh pattern MP1 in the first electrode 11 and the second electrode 21 is preferably 90% or more and more preferably 95% to 99%. Here, the opening ratio of the mesh pattern MP1 is defined as a ratio of the area of a region where the fine metal wires MW1 and MW2 are not present to the unit area of the mesh pattern MP1.

<Flexible Transparent Insulating Substrate>

The flexible transparent insulating substrate 5 is not particularly limited as long as it is transparent, has electric insulating characteristics and flexibility, and supports the first conductive layer 6B and the second conductive layer 6A. For example, a resin substrate is used. Having flexibility represents that, in a case where a substance is wound around a cylinder having a diameter of 10 mm to perform a mandrel test described below, both of cracking and breakage do not occur.

As a material for forming the flexible transparent insulating substrate 5, for example, a polyester polymer such as polyethylene terephthalate (PET) or polyethylene naphthalate (PEN); a polyolefin polymer such as a cycloolefin polymer (COP), a cyclic olefin copolymer (COC), polyethylene (PE), or polypropylene (PP); polycarbonate (PC); an acrylic resin; polystyrene (PS); a vinyl chloride polymer such as polyvinyl chloride (PVC) or polyvinylidene chloride (PVDC); or cellulose triacetate (TAC) can be used. In particular, from the viewpoint of further improving durability and substrate strength, a polyester polymer is preferable.

The thickness of the flexible transparent insulating substrate 5 is not particularly limited as long as it is in a range where flexibility can be secured, and is preferably 10 to 60 µm, more preferably 15 to 50 µm, and still more preferably 20 to 40 µm.

The total light transmittance of the flexible transparent insulating substrate 5 is preferably 40% to 100%. The total light transmittance is measured using "Plastics—Determination of Total Luminous Transmittance and Reflectance" defined by JIS K 7375:2008.

Examples of a preferable aspect of the flexible transparent insulating substrate 5 include a treated substrate that undergoes at least one treatment selected from the group consisting of an atmospheric pressure plasma treatment, a corona discharge treatment, and an ultraviolet irradiation treatment. By performing the above-described treatment, a hydrophilic group such as an OH group is introduced into the treated surface of the flexible transparent insulating substrate 5 such that such that the adhesiveness between the flexible transparent insulating substrate 5 and the first conductive layer 6B is improved. In addition, the atmospheric pressure plasma treatment is preferable among the above-described treatments from the viewpoint of further improving the adhesiveness between the flexible transparent insulating substrate 5 and the first conductive layer 6B.

<Undercoat Layer>

In order to improve the adhesiveness between the flexible transparent insulating substrate 5 and the first conductive layer 6B, an undercoat layer can also be disposed between the flexible transparent insulating substrate 5 and the first conductive layer 6B. This undercoat layer includes a polymer such that the adhesiveness between the flexible transparent insulating substrate 5 and the first conductive layer 6B is further improved.

A method of forming the undercoat layer is not particularly limited, and examples thereof include a method of applying a composition for forming an undercoat layer including a polymer to the substrate and optionally performing a heat treatment thereon. Examples of the composition for forming an undercoat layer including a polymer include gelatin, an acrylic resin, a urethane resin, and an acrylic styrene latex including fine particles of an inorganic material or a polymer.

In the conductive member 3 for a touch panel, optionally, for example, another layer such as a refractive index adjusting layer other than the above-described undercoat layer may be provided between the flexible transparent insulating substrate 5 and the first conductive layer 6B. As the refractive index adjusting layer, for example, an organic layer to which particles of a metal oxide such as zirconium oxide for adjusting a refractive index can be used.

<First Mesh Conductive Layer and Second Mesh Conductive Layer>

The conductive member for a touch panel according to the embodiment includes: a first mesh conductive layer that is formed between the flexible transparent insulating substrate and the interlayer insulating layer and has a mesh pattern; and a second mesh conductive layer that is formed on a surface of the interlayer insulating layer opposite to the first mesh conductive layer side and has a mesh pattern.

Examples of the mesh pattern in the first mesh conductive layer and the second mesh conductive layer include the above-described mesh pattern MP1 in the first electrode 11 shown in FIG. 3, and it is preferable that the mesh pattern is formed of a plurality of fine metal wires.

The first mesh conductive layer and the second mesh conductive layer may include peripheral wires that are connected to the mesh pattern.

Examples of a material for forming the fine metal wires forming the mesh pattern in the first mesh conductive layer and the second mesh conductive layer and the peripheral wires connected to the mesh pattern include copper, aluminum, silver, and an alloy including any one of the above-described metals. It is preferable that the fine metal wire includes copper. In a case where the fine metal wire includes copper, the fine metal wire may further include a metal such as gold or silver other than copper. In addition, the fine metal wire may include a combination of metallic silver and gelatin or a polymer binder such as an acrylic styrene latex that is suitable for forming the mesh pattern. Examples of another preferable metallic material other than copper in the fine metal wire include a metal selected from the group consisting of aluminum, silver, molybdenum, and titanium and an alloy thereof.

Further, the fine metal wire may be formed of a composition including a metal paste such as a silver paste or a copper paste and may include metal oxide particles or metal nanowire particles such as silver nanowire or copper nanowire.

The fine metal wire may have a laminated structure in which a plurality of layers formed of the above-described materials are laminated. Examples of the laminated structure include a laminated structure such as "molybdenum/copper/molybdenum" or "molybdenum/aluminum/molybdenum".

The mesh pattern in the first mesh conductive layer and the second mesh conductive layer may be formed of opaque fine metal wires. The fine metal wire may formed of a material consisting of metal, such as silver or copper, that does not substantially allow transmission of visible light or may include a blackening layer on at least the visible side of the fine metal wire.

Examples of a material in the blackening layer include a metal oxide, a metal nitride, a metal oxynitride, and a metal sulfide. Among these, copper oxynitride, copper nitride, copper oxide, or molybdenum oxide is preferable, and copper oxide is more preferable.

The fine metal wire forming the mesh pattern may have a laminated structure in which a plurality of layers consisting of the blackening layer and a metal-containing layer other than the blackening layer are laminated. In this case, in order to improve the visibility of the fine metal wire, it is more preferable that the blackening layer is present on the visible side of the fine metal wire.

In a case where the fine metal wire forming the mesh pattern has the laminated structure consisting of the blackening layer and the metal-containing layer, it is preferable that the blackening layer and the metal-containing layer include the same metal, and it is more preferable that the blackening layer and the metal-containing layer include copper. Examples of a preferable combination include a combination of a blackening layer including copper oxynitride, copper nitride, or copper oxide and a metal-containing layer including copper.

The fine metal wire forming the mesh pattern may be a fine metal wire having a monolayer structure formed of the above-described material consisting of metal that does not substantially allow transmission of visible light.

The thickness of the fine metal wire (the thickness of each of the mesh conductive layers) is preferably 0.1 to 1 µm, more preferably 0.2 to 0.8 µm, and still more preferably 0.2 to 0.6 μm. By adjusting the thickness to be in the above-described range, the durability of the fine metal wire can be easily improved.

In a case where the fine metal wire has the laminated structure consisting of the blackening layer and the metal-containing layer, a ratio (the thickness of the metal-containing layer/the thickness of the blackening layer) of the thickness of the metal-containing layer to the thickness of the blackening layer is preferably 1 to 50 and more preferably 2 to 20.

Examples of a preferable aspect of the peripheral wire include the same configuration as that of the fine metal wire.

<Interlayer Insulating Layer>

As indicated by 7B in FIG. 1, the interlayer insulating layer is formed to cover the first conductive layer 6B. A material used for forming the interlayer insulating layer is not particularly limited as long as, during the preparation of the conductive member for a touch panel including the flexible transparent insulating substrate, the first conductive layer, the interlayer insulating layer, and the second conductive layer in this order, the thickness of the interlayer insulating layer is 1 to 5 μm, the measured value of brittleness obtained by measuring the conductive member for a touch panel based on the bending resistance test using the cylindrical mandrel method is less than ϕ5 mm, and the insulating properties are imparted to the interlayer insulating layer. For example, any one of an inorganic material or an organic material can be used. Note that an organic material is preferable from the viewpoint of the brittleness of the conductive member for a touch panel.

In the conductive member for a touch panel according to the embodiment, the value of bend resistance (the measured value of brittleness) obtained by measuring the conductive member for a touch panel in the bending resistance test using the cylindrical mandrel method is less than 5 mm.

In the present specification, the bending resistance test using the cylindrical mandrel method is performed according to JIS-K-5600-5-1 (1999), and in a case where a bending test of bending, using a cylindrical mandrel, the conductive member for a touch panel where the first conductive layer, the interlayer insulating layer, and the second conductive layer are laminated on the flexible transparent insulating substrate is performed, whether or not breakage or peeling occurs is checked such that the brittleness of the conductive member for a touch panel or the interlayer insulating layer can be determined.

The bending resistance test using the cylindrical mandrel method will be described in detail. In the bending resistance test, a specimen obtained by cutting the conductive member for a touch panel is wound around a cylindrical mandrel having a predetermined diameter and bent such that the interlayer insulating layer is positioned outside the flexible transparent insulating substrate, and whether or not breakage or peeling occurs in the specimen is checked. In a case where breakage or peeling does not occur, the bending test is performed again using a mandrel having a shorter diameter. The diameter of the mandrel decreases until breakage or peeling occurs in the bending test, and the diameter of the mandrel where breakage or peeling initially occurs (the maximum diameter of the mandrel among the mandrels where breakage or peeling occurs) is obtained as the measured value of brittleness of the conductive member for a touch panel in the bending resistance test using the cylindrical mandrel method.

In the present specification, the measured value of brittleness of the conductive member for a touch panel being less than ϕ5 mm represents that both of breakage and peeling do not occur in the interlayer insulating layer in a case where the conductive member for a touch panel is wound around the mandrel having a diameter of at least 5 mm to perform the bending resistance test. In a case where the measured value of brittleness is less than ϕ5 mm and the thickness of the interlayer insulating layer is in the predetermined range, in a manufacturing process of the touch panel, damage of the conductive layer forming the electrode (for example, disconnection of fine metal wires) is not likely to occur, and a touch sensor having a high yield during manufacturing can be provided. The reason for this is presumed to be that, by using the interlayer insulating layer having excellent brittleness, damage of the conductive layer caused by deformation or bending during handling of the flexible transparent insulating substrate in a manufacturing process is not likely occur, and the yield during manufacturing is improved.

From the viewpoint of further preventing the damage of the conductive layer, the measured value of brittleness of the conductive member for a touch panel is preferably 2 mm or less and more preferably 1 mm or less. The lower limit value is not particularly limited and is preferably 0.1 mm or more.

The measured value of brittleness of the conductive member for a touch panel can be adjusted by changing at least one of the film thickness of the insulating layer, the breaking strength of each of the materials, the adhesiveness between the interlayer insulating layer and the conductive layer, or the adhesiveness between the conductive layer and the substrate.

In the embodiment, the thickness of the interlayer insulating layer is 1 to 5 μm. By adjusting the thickness of the interlayer insulating layer to be 1 to 5 μm, excellent insulating properties and excellent brittleness can be achieved.

The thickness of the interlayer insulating layer is preferably 2 to 5 μm and more preferably 2.5 to 4.5 μm.

In addition, in the conductive member according to the embodiment, from the viewpoint of further improving storage stability, in a case where the thickness (m) of the interlayer insulating layer is represented by X and the measured value (mm) of brittleness of the conductive member for a touch panel is represented by Y, a ratio Y/X is preferably 1.5 or less, more preferably less than 1.0, and still more preferably 0.7 or less. The upper limit of the ratio Y/X is not particularly limited and is preferably 0.001 or more.

Examples of the inorganic material forming the interlayer insulating layer include silicon oxide, silicon nitride, silicon oxynitride, and aluminum oxide.

Examples of the organic material forming the interlayer insulating layer include a resin material, more specifically, an acrylic resin, a siloxane resin, a fluororesin, and a urethane resin. In addition, from the viewpoint of easy formation of the interlayer insulating layer, a photosensitive resin is preferable as the resin material. In particular, from the viewpoint of further improving the film hardness in an etching step, it is preferable to use a photosensitive resin consisting of a polymer that is obtained by polymerization of a monomer/oligomer having an acryloyl group/methacryloyl group.

The interlayer insulating layer may include a filler in addition to the organic material (preferably the photosensitive resin). Examples of the filler include an organic filler consisting of an organic polymer and an inorganic filler such as silica.

It is preferable that the organic material forming the interlayer insulating layer includes a polymer derived from at least one compound selected from the group consisting of a monomer and an oligomer having at least one of an acryloyl group or a methacryloyl group, in which a CLogP value of the compound (the monomer/oligomer having an acryloyl group/methacryloyl group) is 6.0 or more. The interlayer insulating layer includes the polymer of the monomer/oligomer where the CLogP value is 6.0 or more such that the hygroscopicity of the interlayer insulating layer decreases and a decrease in insulating properties in a high humidity environment can be suppressed.

The CLogP value of the monomer/oligomer is more preferably 7.0 or more and still more preferably 8.0 or more. The upper limit value is not particularly limited and is preferably 50 or less.

The CLogP value is a value obtained by calculating the common logarithm log P of the partition coefficient P between 1-octanol and water. The CLogP value can be calculated using a well-known method and software. In the present specification, unless specified otherwise, a value calculated using a CLogP program incorporated in ChemBioDraw Professional 16.0 (manufactured by PerkinElmer Inc.) is used.

The CLogP value of the monomer/oligomer can be calculated using the above-described method from a structure of a constitutional unit that is obtained by analyzing the polymer as the organic material in the interlayer insulating layer using a well-known method. In a case where monomer/oligomer is a commercially available product, the CLogP value may be a catalog value.

In a case where two or more kinds of the monomer/oligomers are used in combination, it is preferable that the CLogP value of each of the two or more kinds of the monomers and the oligomers is in the above-described range.

In addition, as the organic material forming the interlayer insulating layer, it is also preferable to use a polymer derived from at least one compound selected from the group consisting of a monomer and an oligomer having at least one of an acryloyl group or a methacryloyl group, in which an acrylic equivalent of the compound (the monomer/oligomer having an acryloyl group/methacryloyl group) is 180 or more. The acrylic equivalent corresponds to the molecular weight of the compound for each of the acryloyl group and the methacryloyl group. In a case where two or more kinds of the compounds are used in combination, the acrylic equivalent refers to the arithmetic mean mass value of the acrylic equivalents of the two or more kinds of compounds.

In a case where the acrylic equivalent is 180 or more, the crosslinking density with which appropriate flexibility can be imparted to the interlayer insulating layer can be obtained.

The acrylic equivalent of the compound is more preferably 195 or more and still more preferably 210 or more. The upper limit value is not particularly limited and is preferably 500 or less.

The acrylic equivalent of the monomer/oligomer can be calculated from a structure of a constitutional unit that is obtained by analyzing the polymer as the organic material in the interlayer insulating layer using a well-known method.
(Composition for Forming Interlayer Insulating Layer (Composition A))

As the interlayer insulating layer, a layer that is formed of a composition for forming an interlayer insulating layer including the above-described resin material is preferable, a layer that is formed of a composition for forming an interlayer insulating layer including a polymerizable compound having a (meth)acryloyl group as a polymerizable group is more preferable.

Hereinafter the composition for forming an interlayer insulating layer (also referred to as "composition A") including a polymerizable compound having a (meth)acryloyl group will be described in more detail.

The polymerizable compound (polymerizable group-containing compound) is not particularly limited as long as it is a compound having an acryloyl group or a methacryloyl group as a polymerizable group, and may be any form selected from a monomer, an oligomer, or a polymer. That is, the polymerizable compound may be an oligomer having a polymerizable group or may be a polymer having a polymerizable group. In particular, the polymerizable compound is preferably a monomer or an oligomer.

The monomer is preferably a compound having a molecular weight of less than 1000.

In addition, the oligomer or the polymer is a polymer obtained by bonding a finite number (in general 5 to 100) of monomers. The oligomer is a compound having a weight-average molecular weight of 3000 or less, and the polymer is a compound having a weight-average molecular weight of more than 3000.

The polymerizable compound in the composition A may be one kind or may be a combination of plural kinds.

In addition, the polymerizable compound may be monofunctional or polyfunctional.

Examples of a monofunctional (meth)acrylate include: a long-chain alkyl (meth)acrylate such as butyl (meth)acrylate, amyl (meth)acrylate, 2-ethylhexyl (meth)acrylate, octyl (meth)acrylate, nonyl (meth)acrylate, dodecyl (meth)acrylate, lauryl (meth)acrylate, hexadecyl (meth)acrylate, or octadecyl (meth)acrylate; a (meth)acrylate having a cyclic structure such as cyclohexyl (meth)acrylate, benzyl (meth)acrylate, phenoxyethyl (meth)acrylate, nonylphenoxyethyl (meth)acrylate, tetrahydrofurfuryl (meth)acrylate, nonylphenoxy ethyl tetrahydro furfuryl (meth)acrylate, caprolactone-modified tetrafurfuryl (meth)acrylate, isobornyl (meth)acrylate, dicyclopentanyl (meth)acrylate, dicyclopentenyl (meth)acrylate, dicyclopentenyloxyethyl (meth)acrylate, ethylene oxide-modified nonylphenol (meth)acrylate, propylene oxide-modified nonylphenol (meth)acrylate, or 2-ethylhexyl carbitol (meth)acrylate; and glycidyl (meth)acrylate, methoxyethyl (meth)acrylate, butoxyethyl (meth)acrylate, 2-hydroxyethyl (meth)acrylate, 2-hydroxypropyl (meth)acrylate, 3-chloro-2-hydroxypropyl (meth)acrylate, dimethylaminoethyl (meth)acrylate, 2-(meth)acryloyloxyethyl acid phosphate, diethylaminoethyl (meth)acrylate, isomyristyl (meth)acrylate, isostearyl (meth)acrylate, 3-hydroxypropyl (meth)acrylate, 4-hydroxybutyl (meth)acrylate, isobornyl (meth)acrylate, and an ester of (meth)acrylic acid and a polyhydric alcohol.

Examples of a bifunctional (meth)acrylate include ethylene glycol di(meth)acrylate, diethylene glycol di(meth)acrylate, triethylene glycol di(meth)acrylate, tetraethylene glycol di(meth)acrylate, 1,4-butanediol di(meth)acrylate, 1,6-hexanediol di(meth)acrylate, 1,9-nonanediol di(meth)acrylate, glycerin di(meth)acrylate, neopentyl glycol di(meth)acrylate, 3-methyl-1,5-pentanediol di(meth)acrylate, 2-butyl-2-ethyl-1,3-propane di(meth)acrylate, dimethylol tricyclodecane di(meth)acrylate, propylene glycol di(meth)acrylate, dipropylene glycol di(meth)acrylate, tripropylene glycol di(meth)acrylate, tetrapropylene glycol di(meth)acrylate, neopentyl glycol hydroxy pivalate di(meth)acrylate, 1,3-butanediol di(meth)acrylate, dimethylol dicyclopentane diacrylate, hexamethylene glycol diacrylate, hexaethylene glycol di(meth)acrylate, polyethylene glycol di(meth)acrylate, polypropylene glycol di(meth)acrylate, butylene glycol di(meth)acrylate, 2,2'-bis(4-(acryloxydiethoxyphenyl)propane, and bisphenol A tetraethylene glycol diacrylate.

Examples of a trifunctional (meth)acrylate include trimethylolpropane tri(meth)acrylate, ethylene oxide-modified trimethylolpropane tri(meth)acrylate, propylene oxide-modified trimethylolpropane tri(meth)acrylate, tris(acryloxyethyl)isocyanurate, caprolactone-modified tris(acryloxyethyl)isocyanurate, pentaerythritol tri(meth)acrylate, dipentaerythritol tri(meth)acrylate, alkyl-modified dipentaerythritol tri(meth)acrylate, tetramethylol methane tri(meth)acrylate, ethylene oxide-modified glycerol triacrylate, propylene oxide-modified glycerol triacrylate, caprolactone-modified trimethylolpropane triacrylate, and pentaerythritol triacrylate.

Examples of a tetrafunctional (meth)acrylate include ditrimethylolpropane tetra(meth)acrylate, pentaerythritol ethoxy tetra(meth)acrylate, and pentaerythritol tetra(meth)acrylate.

Examples of a pentafunctional or higher (meth)acrylate compound include dipentaerythritol penta(meth)acrylate, alkyl-modified dipentaerythritol penta(meth)acrylate, dipentaerythritol hexa(meth)acrylate, caprolactone-modified dipentaerythritol hexa(meth)acrylate, and polypentaerythritol polyacrylate.

Further, as described above, the polymerizable compound may be an oligomer or a polymer having a (meth)acryloyl group. In addition, the number of polymerizable groups may be one or may be two or more and is preferably two or more.

The oligomer or the polymer having a (meth)acryloyl group functions as a prepolymer. In other words, the oligomer or the polymer having a (meth)acryloyl group is obtained by polymerization with another monomer or a polyfunctional compound.

A method of manufacturing the prepolymer is not particularly limited, and examples thereof include a method of polymerization in a solution in which the above-described monofunctional (meth)acrylate, a photopolymerization initiator or a thermal polymerization initiator, and a solvent are mixed. A method of forming the prepolymer is preferably thermal polymerization.

In addition, as described it is preferable to form the interlayer insulating layer including, as the organic material, the polymer that is obtained by polymerization using the above-described monomer/oligomer having a (meth)acryloyl group as the polymerizable compound.

In particular, from the viewpoint of decreasing the hygroscopicity of the interlayer insulating layer such that a decrease in insulating properties in a high humidity environment can be suppressed, it is preferable that the monomer/oligomer having a (meth)acryloyl group is a monomer/oligomer having a CLogP value of 6.0 or more (more preferably the above-described range).

In addition, from the viewpoint of suppressing damage of the interlayer insulating layer in a second conductive layer photolithography step or an etching step such that the interlayer insulating performance can be stably maintained, it is preferable that the monomer/oligomer having a (meth)acryloyl group is a monomer/oligomer having an acrylic equivalent of 180 or more (more preferably the above-described range).

The polymerizable compound having a (meth)acryloyl group may be a urethane (meth)acrylate compound or an epoxy (meth)acrylate compound. From the viewpoint of weather fastness, a urethane (meth)acrylate compound is preferable. From the viewpoint of suppressing yellowing, an aliphatic urethane (meth)acrylate compound is preferable.

Specifically, it is preferable that urethane (meth)acrylate compound is a compound having two or more photopolymerizable groups selected from the group consisting of an acryloyloxy group, an acryloyl group, a methacryloyloxy group, and a methacryloyl group in one molecule and having one or more urethane bonds in one molecule. This compound can be manufactured, for example, through a urethanization reaction of isocyanate and a hydroxy group-containing (meth)acrylate compound. The urethane (meth)acrylate compound may be a so-called oligomer or polymer. The photopolymerizable group is a polymerizable group capable of radical polymerization.

The number of photopolymerizable groups in one molecule of the urethane (meth)acrylate compound is, for example, preferably at least two, more preferably 2 to 10, and still more preferably 2 to 6. Two or more photopolymerizable groups in the urethane (meth)acrylate compound may be the same as or different from each other.

In particular, an acryloyloxy group or a methacryloyloxy group is preferable as the photopolymerizable group.

The number of urethane bonds in one molecule of the urethane (meth)acrylate compound only needs to be one or more and is preferably 2 or more and more preferably 2 to 5.

In the urethane (meth)acrylate compound having two urethane bonds in one molecule, the photopolymerizable group may be bonded to only one urethane bond directly or through a linking group or may be bonded to each of two urethane bonds directly or through a linking group.

In one aspect, it is preferable that the photopolymerizable group is bonded to each of two urethane bonds directly or through a linking group.

As described above, in the urethane (meth)acrylate compound, the urethane bond and the photopolymerizable group may be bonded to each other directly, or a linking group may be present between the urethane bond and the photopolymerizable group. The linking group is not particularly limited, and examples thereof include a linear or branched saturated or unsaturated hydrocarbon group, a cyclic group, and a group consisting of a combination of two or more thereof. The number of carbon atoms in the hydrocarbon group is, for example, about 2 to 20 and is not particularly limited. In addition, examples of the cyclic structure in the cyclic group include an aliphatic ring (for example, a cyclohexane ring) and an aromatic ring (for example, a benzene ring or a naphthalene ring). The above-described groups may be unsubstituted or may have a substituent.

The urethane (meth)acrylate compound can be synthesized using a well-known method. In addition, the urethane (meth)acrylate compound can also be commercially available.

Examples of the synthesis method include a method causing an alcohol, a polyol, and/or a hydroxy group-containing compound such as a hydroxy group-containing (meth)acrylate and isocyanate to react with each other. In addition, a method of optionally esterifying the urethane compound obtained by the above-described reaction with (meth)acrylic acid can be used.

Examples of the isocyanate include aromatic, aliphatic, and alicyclic polyisocyanates, for example, tolylene diisocyanate, diphenylmethane diisocyanate, hydrogenated diphenylmethane diisocyanate, polyphenylmethane polyisocyanate, modified diphenylmethane diisocyanate, hydrogenated xylylene diisocyanate, xylylene diisocyanate, hexamethylene diisocyanate, trimethylhexamethylene diisocyanate, tetramethylxylylene diisocyanate, isophorone diisocyanate, norbornene diisocyanate, 1,3-bis(isocyanatomethyl)cyclohexane, phenylene diisocyanate, lysine diisocyanate, lysine triisocyanate, and naphthalene diisocyanate. These isocyanates may be used alone or as a combination of two or more kinds.

Examples of the hydroxy group-containing (meth)acrylate include 2-hydroxyethyl acrylate, 2-hydroxypropyl acrylate, 2-hydroxybutyl acrylate, 4-hydroxybutyl acrylate, 2-hydroxyethylacryloyl phosphate, 2-acryloyloxyethyl-2-hydroxypropyl phthalate, glycerin diacrylate, 2-hydroxy-3-acryloyloxypropyl acrylate, pentaerythritol triacrylate, dipentaerythritol pentaacrylate, caprolactone-modified 2-hydroxyethyl acrylate, and cyclohexanedimethanol monoacrylate. The hydroxy group-containing (meth)acrylates may be used alone or as a combination of two or more kinds.

The commercially available product of the urethane (meth)acrylate compound is not limited to the following examples, but examples thereof include: UA-306H, UA-306I, UA-306T, UA-510H, UF-8001G, UA-101I, UA-101T, AT-600, AH-600, and AI-600 manufactured by Kyoeisha Chemical Co., Ltd.; U-4HA, U-6HA, U-6LPA, UA-32P, U-15HA, and UA-1100H manufactured by Shin-Nakamura Chemical Co., Ltd.; and UV-1400B, UV-1700B, UV-6300B, UV-7550B, UV-7600B, UV-7605B, UV-7610B, UV-7620EA, UV-7630B, UV-7640B, UV-6630B, UV-7000B, UV-7510B, UV-7461TE, UV-3000B, UV-3200B, UV-3210EA, UV-3310EA, UV-3310B, UV-3500BA, UV-3520TL, UV-3700B, UV-6100B, UV-6640B, UV-2000B, UV-2010B, and UV-2250EA manufactured by Nippon Synthetic Chemical Industry Co., Ltd. In addition, for example, UV-2750B manufactured by Nippon Synthetic Chemical Industry Co., Ltd., UL-503LN manufactured by Kyoeisha Chemical Co., Ltd., UNIDIC 17-806, 17-813, V-4030, and V-4000BA manufactured by DIC Corporation, EB-1290K manufactured by Daicel-Allnex Ltd., and HI-COOP AU-2010 and AU-2020 manufactured by Tokushiki Co., Ltd. can also be used.

Examples of a hexa- or higher functional urethane (meth)acrylate compound include: ARTRESIN UN-3320HA, ARTRESIN UN-3320HC, ARTRESIN UN-3320HS, and ARTRESIN UN-904 manufactured by Negami Chemical Industrial Co., Ltd.; UV-1700B, UV-7605B, UV-7610B, UV-7630B, and UV-7640B manufactured by Nippon Synthetic Chemical Industry Co., Ltd.; NK OLIGO U-6PA, NK OLIGO U-10HA, NK OLIGO U-10PA, NK OLIGO U-1100H, NK OLIGO U-15HA, NK OLIGO U-53H, and NK OLIGO U-33H manufactured by Shin-Nakamura Chemical Co., Ltd.; KRM 8452, EBECRYL 1290, KRM 8200, EBECRYL 5129, and KRM 8904 manufactured by Daicel-Allnex Ltd.; and UX-5000 manufactured by Nippon Kayaku Co., Ltd.

The molecular weight (weight-average molecular weight Mw) of the urethane (meth)acrylate compound is preferably in a range of 300 to 10000. In a case where the molecular weight is in the above-described range, the interlayer insulating layer having excellent flexibility and excellent surface hardness can be obtained.

The epoxy (meth)acrylate compound is a compound obtained by an addition reaction of polyglycidyl ether and (meth)acrylic acid and is likely to have at least two (meth)acryloyl groups in a molecule.

The content of at least one selected from the group consisting of the urethane (meth)acrylate compound and the epoxy (meth)acrylate compound in the composition for forming an interlayer insulating layer is not particularly limited.

The urethane (meth)acrylate compounds and the epoxy (meth)acrylate compounds can be used alone or as a combination of two or more kinds, respectively.

From the viewpoints of etching resistance, adhesiveness, leveling, and hardness, it is preferable that the polymerizable compound includes a bi- or higher functional (meth)acrylate monomer (polyfunctional (meth)acrylate monomer).

In a case where the polymerizable compound includes a polyfunctional (meth)acrylate monomer, the content of the polyfunctional (meth)acrylate monomer is not particularly limited. The polymerizable compound may include a monofunctional (meth)acrylate monomer but preferably consists of only the polyfunctional (meth)acrylate monomer.

Examples of the polyfunctional (meth)acrylate monomer include pentaerythritol tri(meth)acrylate, pentaerythritol tetra(meth)acrylate, dipentaerythritol hexa(meth)acrylate, and dipentaerythritol penta(meth)acrylate.

The polyfunctional (meth)acrylate monomers can be used alone or as a combination of two or more kinds.

In a case where the polymerizable compound includes a monofunctional monomer as a diluent monomer, the content of the monofunctional monomer with respect to the total mass of the polymerizable compound is not particularly limited and is preferably as low as possible, more preferably 40 mass % or less, and still more preferably 10 mass % or less.

The composition A may include a polymerization initiator. The polymerization initiator may be any one of a photopolymerization initiator or a thermal polymerization initiator and is preferably a photopolymerization initiator.

The kind of the photopolymerization initiator is not particularly limited, and a well-known photopolymerization initiator (a radical photopolymerization initiator or a cationic photopolymerization initiator) can be used.

Specific examples of the photopolymerization initiator include: a carbonyl compound such as acetophenone, 2,2-diethoxyacetophenone, p-dimethylacetophenone, p-dimethylaminopropiophenone, benzophenone, 2-chlorobenzophenone, benzyl, benzoin, benzoin methyl ether, benzoin ethyl ether, benzoin isopropyl ether, 2,2-dimethoxy-1,2-diphenylethane-1-one, 1-cyclohexylphenyl ketone, 1-hydroxy-cyclohexyl-phenyl ketone, 2-hydroxy-2-methyl-1-phenyl-propane-1-one, 1-[4-(2-hydroxyethoxy)-phenyl]-2-hydroxy-2-methyl-1-propane-1-one, oligo(2-hydroxy-2-methyl-1-(4-(1-methylvinyl)phenyl)propanone, 2-hydroxy-1-{4-[4-(2-hydroxy-2-methyl-propionyl)-benzyl]-phenyl}-2-methyl-propane-1-one, 2-methyl-1-[4-(methylthio)phenyl]-2-morpholinopropan-1-one, 2-benzyl-2-dimethylamino-1-(4-morpholinophenyl)-butanone-1, bis(2,4,6-trimethylbenzoyl)-phenylphosphine oxide, 2,4,6-trimethylbenzoyl-diphenyl-phosphine oxide, bis(2,6-dimethoxybenzoyl)-2,4,4-trimethyl-pentylphosphine oxide, ethyl-(2,4,6-trimethylbenzoyl)-phenylphosphinate, 1,2-octanedione, 1-[4-(phenylthio)-2-(O-benzoyloxime)], methyl-benzoylformate, 4-methylbenzophenone, 4-phenylbenzophenone, 2,4,6'-trimethyl benzophenone, 4-benzoyl-4'-methyldiphenyl sulfide, or 1-[4-(4-benzoylphenylsulfanyl)phenyl]-2-methyl-2-(4-methylphenylsulfonyl)propan-1-one; and a sulfur compound such as thioxanthone, 2-chlorothioxanthone, 2-methylthioxanthone, and tetramethylthiuram disulfide.

The polymerization initiators can be used alone or as a combination of two or more kinds.

In a case where the composition A includes a polymerization initiator, the content of the polymerization initiator is not particularly limited and, from the viewpoint of curing properties of the interlayer insulating layer, is preferably 0.1 to 10 mass % with respect to the total mass of the composition. In a case where two or more polymerization initiators are used, it is preferable that the total content of the polymerization initiators is in the above-described range.

In addition to the above-described components, various well-known particle-shaped or foil-shaped additives in the related art, for example, a surface lubricant, an antioxidant, a corrosion inhibitor, a light stabilizer, an ultraviolet absorber, a polymerization inhibitor, a silane coupling agent, an inorganic or organic filler, or powder such as metal powder or a pigment can be appropriately added to the composition A. The details can refer to, for example, paragraphs "0032" to "0034" of JP2012-229412A. For the composition A, various additives that can be used for a photopolymerizable composition can be used without being limited to the above-described additives. In addition, the addition amounts of the additives to the composition A may be appropriately adjusted and are not particularly limited.

In addition, the composition A may include a solvent from the viewpoint of handleability. However, from the viewpoint of suppressing volatile organic compounds (VOC) and the viewpoint of reducing the tact time, it is preferable that the composition A does not include a solvent.

In a case where the composition A includes a solvent, the solvent to be used is not particularly limited, and examples thereof include water and an organic solvent.

A method of forming the interlayer insulating layer using the composition A will be described below.

<Cover Panel>

In the touch panel including the conductive member for a touch panel according to the embodiment, it is also preferable to dispose a cover panel on a touch surface side of the conductive member for a touch panel.

Examples of a material of the cover panel 2 include reinforced glass, polycarbonate, polyethylene terephthalate, and polymethyl methacrylate (PMMA). The thickness of the cover panel 2 is preferably 0.1 to 1.5 mm.

<Adhesive Layer>

As the adhesive layer 4 that bonds the cover panel 2 and the conductive member 3 for a touch panel to each other, for example, an optical transparent adhesive sheet (optical clear adhesive: OCA) or an optical transparent adhesive resin (optical clear resin: OCR) can be used. The film thickness of the adhesive layer is not particularly limited and is preferably 10 to 200 μm. As the optical transparent adhesive sheet, for example, 8146 series (manufactured by 3M) can be used.

Second Embodiment

Hereinafter, a conductive member for a touch panel according to a second embodiment of the present invention will be described.

The conductive member for a touch panel according to the second embodiment comprises a first mesh conductive layer, an interlayer insulating layer, and a second mesh conductive layer in this order on a flexible transparent insulating substrate, in which in a case where a thickness (μm) of the interlayer insulating layer is represented by X and a value (mm) of bend resistance obtained by measuring the conductive member for a touch panel in a bending resistance test using a cylindrical mandrel method according to JIS-K5600-5-1 is represented by Y, Y/X is 1.5 or less.

In a case where the ratio Y/X is in the above-described range, even in a case where the conductive member for a touch panel is left to stand in a high temperature and high humidity environment, a change in resistance value is small. Alternatively, even in a case where the conductive member for a touch panel is left to stand in a state where a voltage is applied between adjacent electrodes in a high temperature and high humidity environment, deterioration of the electrodes is small, for example, failure such as short-circuit caused by elution of metal ions is not likely to occur between adjacent electrodes. This change can be evaluated based on a reliability evaluation where the state of the fine metal wires or the peripheral wires after providing the conductive member for an accelerated aging test is used as an index. Specific examples of the state of the fine metal wires or the peripheral wires include bleeding (for example, a change in the size of an intersection portion of the fine metal wires), coloration, and dendrite.

The details of the mechanism in which the storage stability is improved by adjusting the ratio Y/X of the conductive member to be 1.5 or less are not clear but is presumed to be as follows. However, by adjusting the thickness X of the interlayer insulating layer to be relatively large, penetration of foreign matter such as moisture into the interlayer insulating layer or an interface between the interlayer insulating layer and another layer can be suppressed. By adjusting the measured value Y of brittleness of the conductive member for a touch panel to be relatively small, the adhesiveness between each of the conductive layers and the insulating layer is high, deterioration of the conductive layers is suppressed, a change in resistance value in a high temperature and high humidity environment of each of the conductive layers that are disposed adjacent to the interlayer insulating layer can be suppressed, and the storage stability can be improved.

The conductive member for a touch panel according to the embodiment comprises a flexible transparent insulating substrate, a first mesh conductive layer, an interlayer insulating layer, and a second mesh conductive layer in this order.

The conductive member for a touch panel according to the embodiment is the same as the conductive member for a touch panel according to the first embodiment including the preferable aspects, except that the ratio Y/X is 1.5 or less and the thickness of the interlayer insulating layer and the measured value of brittleness are not limited. Therefore, the description of the flexible transparent insulating substrate, the first mesh conductive layer, the interlayer insulating layer, and the second mesh conductive layer in the conductive member for a touch panel according to the embodiment will not be repeated except for the following features.

In the embodiment, the ratio Y/X of the measured value Y (mm) of brittleness to the thickness X (m) of the interlayer insulating layer is preferably less than 1.0 and more preferably 0.7 or less from the viewpoint of further improving storage stability. The upper limit of the ratio Y/X is not particularly limited and is preferably 0.001 or more.

The ratio Y/X can be adjusted by adjusting each of the thickness X of the interlayer insulating layer and the measured value Y of brittleness. A method of adjusting the measured value Y of brittleness is as described above.

From the viewpoint of simultaneously achieving excellent insulating properties and excellent brittleness, the thickness X of the interlayer insulating layer according to the embodiment is preferably 1 to 5 μm, more preferably 2 to 5 μm, and still more preferably 2.5 to 4.5 μm.

From the viewpoint of further preventing the damage of the conductive layer, the measured value Y of brittleness of the conductive member for a touch panel according to the embodiment is preferably less than 5 mm, more preferably 2 mm or less, and still more preferably 1 mm or less. The lower limit value is not particularly limited.

The conductive member for a touch panel according to the embodiment may further include other layers such as the undercoat layer or the adhesive layer described above in addition to the flexible transparent insulating substrate, the first conductive layer, the interlayer insulating layer, and the second conductive layer. The other layers are the same as those of the first embodiment, and thus the description thereof will not be repeated.

[Method of Manufacturing Conductive Member for Touch Panel]

The method of manufacturing the conductive member for a touch panel according to each of the embodiments is not particularly limited and is, for example, a method of manufacturing a conductive member for a touch panel (hereinafter, also referred to as "the present manufacturing method"), the conductive member including a first conductive layer, an interlayer insulating layer, and a second conductive layer in this order on a flexible transparent insulating substrate, and the method comprising: a step 1 of forming the first conductive layer on the flexible transparent insulating substrate; a step 2 of forming the interlayer insulating layer on the first conductive layer; and a step 3 of forming the second conductive layer on the interlayer insulating layer, in which each of the step 1 of forming the first conductive layer and the step 3 of forming the second conductive layer includes a step of forming a fine metal wire using a photolithography method.

<Step 1 and Step 3>

In the present manufacturing method, in the step 1 of forming the first conductive layer on the flexible transparent insulating substrate and the step 3 of forming the second conductive layer on the interlayer insulating layer, at least the step of forming the fine metal wires using a photolithography method is performed. The step 1 and the step 3 include, for example, a step of forming a metal foil layer and a step of forming each of the conductive layers by forming the fine metal wires from the formed metal foil layer using a photolithography method.

The present manufacturing method is preferably a method of manufacturing a conductive member for a touch panel including: a step 1 of forming the first conductive layer through a step of forming a first metal foil layer on the flexible transparent insulating substrate and a step of forming the fine metal wires from the first metal foil layer using a photolithography method; a step 2 of forming the interlayer insulating layer on the first conductive layer; and a step 3 of forming the second conductive layer through a step of forming a second metal foil layer on the interlayer insulating layer and a step of forming the fine metal wires from the second metal foil layer using a photolithography method.

(Step of Forming Metal Foil Layer)

Examples of a method of forming the metal foil layer in the step 1 and the step 3 include well-known methods. Examples of the well-known methods include: a method using a wet process, for example, an application method, an ink jet method, a coating method, or a dipping method; and a method using a dry process, for example, a vapor deposition method (for example, resistance heating or an EB method), a sputtering method, or a CVD method. Among the film forming methods, a sputtering method is preferably applied.

In a case where opaque fine metal wires are formed using a photolithography method in the step 1 and the step 3, examples of a method of forming the metal foil layer include: a method of forming only the blackening layer using the above-described film forming method; and a method of forming the metal foil layer having the laminated structure consisting of the blackening layer and the metal-containing layer by forming the blackening layer formed of an opaque metallic material using the above-described film forming method and subsequently forming the metal-containing layer on the blackening layer using the above-described film forming method.

(Step of Forming Fine Metal Wires)

In the present manufacturing method, in the step 1 and the step 3, by etching the metal foil layer using a photolithography method, the fine metal wires including the desired mesh pattern and the peripheral wires and the like connected to the mesh pattern can be formed.

The photolithography method is, for example, a method of processing the metal foil layer into the desired pattern by performing each of steps of resist application, exposure, development, rinsing, etching, and resist stripping on the above-described metal foil layer.

In the present manufacturing method, a general well-known photolithography method of the related art can be appropriately used. For example, as the resist, any one of a positive tone resist or negative tone resist can be used. In addition, after the resist application, optionally, pre-heating or pre-baking can be performed. During the exposure, a pattern mask having a predetermined pattern may be disposed and light (for example, ultraviolet light) having a wavelength suitable for the used resist may be irradiated through the pattern mask. After the exposure, development can be performed using a developer suitable for the used resist. After the development, by stopping the development and performing rising using a rinsing liquid such as water, a resist pattern is formed.

Next, the formed resist pattern can be engraved by etching after optionally performing pre-treatment or post-baking. As the etchant, a liquid that can be used depending on the kind of the metal forming the metal foil layer can be appropriately selected. For example, in a case where the metal foil layer includes copper, a well-known copper etchant such as a ferric chloride (III) aqueous solution can be used.

By stripping the remaining resist after etching, the fine metal wires having the desired pattern can be obtained. This way, the photolithography method that is applied to the present manufacturing method is a method that is generally acknowledged by a person skilled in the art, and a specific application aspect thereof can be easily selected depending on a predetermined purpose by a person skilled in the art.

The step of forming the metal foil layer and the step of forming the electrode pattern can be applied to both of the step 1 of forming the first conductive layer and the step 3 of forming the second conductive layer.

<Step 2>

The present manufacturing method includes the step 2 of forming the interlayer insulating layer on the first conductive layer formed in the step 1.

A method of forming the interlayer insulating layer is not particularly limited as long as it is a method capable of accurately forming the interlayer insulating layer on the first conductive layer, and examples thereof include a photolithography method and a printing method such as screen printing. In particular, it is preferable that the interlayer insulating layer is formed on the first conductive layer using the above-described composition for forming an interlayer insulating layer (composition A).

A method of forming the interlayer insulating layer using the composition A is not particularly limited, and examples thereof include a method of forming the interlayer insulating layer as a cured film by applying the composition A to the first conductive layer to form a coating film and optionally performing a treatment selected from the group consisting of a drying treatment and an exposure treatment.

A method of applying the composition A to the first conductive layer is not particularly limited, and a well-known method (for example, an application method using an application unit such as a gravure coater, a comma coater, a bar coater, a knife coater, a die coater, or a roll coater, an ink jet method, or a screen printing method) can be used. In particular, a screen printing method is preferable. In the screen printing method, in principle, unevenness is formed on the coating film surface as compared to bar coating method. However, by using the composition A, a coating film having high leveling can also be formed with the screen printing method.

From the viewpoints of handleability and manufacturing efficiency, an aspect of forming a coating film by applying the composition A to the flexible transparent insulating substrate and the first conductive layer and optionally performing the drying treatment to remove the remaining solvent is preferable.

Conditions of the drying treatment are not particularly limited. From the viewpoint of further improving productivity, it is preferable that the drying treatment is performed at room temperature to 220° C. (preferably 50° C. to 120° C.) for 1 to 30 minutes (preferably 1 to 10 minutes). From the viewpoint of productivity, it is preferable that the composition A does not include a solvent component and the drying step is not performed in the step 2.

It is preferable that the exposure treatment is performed after optionally drying the coating film of the composition A.

A method of the exposure treatment is not particularly limited, and examples thereof include a method of irradiating an actinic ray or a radiation. Examples of the irradiation with the actinic ray include light irradiation with an ultraviolet (UV) lamp or visible light. Examples of the light source include a mercury lamp, a metal halide lamp, a xenon lamp, a chemical lamp, and a carbon arc lamp. In addition, examples of the radiation include an electron beam, an X-ray, an ion beam, and a far infrared ray.

By exposing the coating film, a polymerizable group of the polymerizable compound in the coating film is activated, the compounds are crosslinked, and the curing of the layer progresses. The exposure energy may be about 10 to 8000 mJ/cm$^2$ and is preferably in a range of 50 to 3000 mJ/cm$^2$.

In the present manufacturing method, the conductive member for a touch panel is manufactured by forming the interlayer insulating layer in the step 2 and forming the second conductive layer on the interlayer insulating layer in the step 3.

Depending on the desired configuration of the conductive member for a touch panel, the present manufacturing method may include other steps such as a step of forming the undercoat layer and a step of forming the adhesive layer.

[Use of Conductive Member]

The conductive member according to the embodiment of the present invention can be applied manufacture of a touch panel (or a touch panel sensor) and, in particular, is preferably used for manufacturing a capacitance-type touch panel.

In the touch panel including the conductive member, the first conductive layer and the second conductive layer can effectively function as a detection electrode. Examples of a display panel that is used in combination with the conductive member in the touch panel including the conductive member include a liquid crystal panel and an organic light emitting diode (OLED) display panel. Among these, an OLED panel is preferable.

In addition, the conductive member according to the embodiment of the present invention can also be applied to manufacturing of devices such as a semiconductor chip, various electric circuit boards, a flexible printed circuit (FPC), a chip on film (COF), a tape automated bonding (TAB), an antenna, a multilayer interconnection board, or a mother board.

The conductive member may also be used in the form of a laminate including the conductive member and another member such as a pressure-sensitive adhesive sheet or a peeling sheet during handling and transport. The peeling sheet functions as a protective sheet for preventing damage of the conductive member during the transport of the laminate.

In addition, the conductive member may be handled in the form of a composite body including the conductive member, the pressure-sensitive adhesive sheet, and the protective layer in this order.

EXAMPLES

The present invention will be described in more detail based on the following examples. Materials, used amounts, ratios, treatment details, and treatment procedures shown in the following examples can be appropriately changed within a range not departing from the scope of the present invention. Accordingly, the scope of the present invention is not limited to the following examples.

Example 1

First, as the flexible transparent insulating substrate, a PET film (manufactured by Toyobo Co., Ltd., COSMOSHINE (registered trade name) A4300) having a thickness of 50 m where an easy adhesion layer was formed on both surfaces was prepared.

(Formation of First Conductive Layer (Step 1))

Next, as the adhesion layer (blackening layer), a copper oxide film was formed on a single surface of the PET film. In this case, copper was used as a target, and while introducing mixed gas of oxygen gas (flow rate: 90 sccm) and argon gas (flow rate: 270 sccm) into a sputtering device, sputtering was performed under conditions of film formation chamber internal pressure: 0.4 Pa, power density: 1.7 W/cm$^2$, and film formation roll temperature: 90° C. The thickness of the obtained copper oxide film was 20 nm.

Next, a copper film was formed on the surface side of the PET film where the copper oxide film was formed. Copper was used as a target, and while introducing argon gas (flow rate: 270 sccm) into a sputtering device, sputtering was performed under conditions of film formation chamber internal pressure: 0.4 Pa, power density: 4.2 W/cm$^2$, and film formation roll temperature: 90° C. In the laminate obtained as described above, the thickness of the copper film was 300 nm.

After forming the copper film, a rust preventing treatment was performed on the copper film, and the copper film was patterned using a photolithography method. More specifically, a positive tone resist was applied to the copper film to form a resist film having a thickness of 2 m. Next, a glass photomask was prepared, the photomask including: a plurality of first electrodes 11 consisting of a regular mesh pattern MP1 having a line width of 4.5 μm where rhombuses having one side length of 600 μm and an acute angle of 65 degrees were continuous; a plurality of first pads 12 positioned at end parts of the plurality of first electrodes; a plurality of first peripheral wires 13 led out from the plurality of first pads 12; and a plurality of first external connection terminals 14 connected to the plurality of first peripheral wires. Next, the copper film was irradiated with light from a metal halide lamp in a state where the glass photomask was disposed on the resist film, and the laminate where the resist film was disposed was dipped in a sodium hydroxide aqueous solution having a concentration of 3% to be developed. As a result, the resist film having the pattern corresponding to the glass photomask was obtained. By using the resist film as a mask, the copper oxide film and the copper film were simultaneously etched using a ferric chloride (III) aqueous solution having a concentration of 5% to perform patterning. Finally, the remaining resist film was stripped, and the first conductive layer 6B having the mesh pattern MP1 formed of the fine metal wires MW1 having a thickness of 3 μm was obtained.

(Formation of Interlayer Insulating Layer (Step 2))

The composition A including a monomer M-1 (OGSOL EA0200, manufactured by Osaka Gas Chemicals Co., Ltd., CLogP: 8.0, acrylic equivalent: 273) and 3 mass % of IRGACURE 184 was applied using a screen printing method to regions other than the plurality of first external connection terminals 14 on a surface of the first conductive layer 6B opposite to the PET film to form a coating film, and was irradiated with UV-A using a metal halide lamp (exposure amount: 1000 mJ/cm$^2$). As a result, the interlayer insulating layer 7B having a thickness of 3 μm was formed.

(Formation of Second Conductive Layer (Step 3))

Next, a copper oxide film as the adhesion layer (blackening layer) was formed on a surface of the interlayer insulating layer 7B opposite to the conductive layer 6B side. In this case, copper was used as a target, and while introducing mixed gas of oxygen gas (flow rate: 90 sccm) and argon gas (flow rate: 270 sccm) into a sputtering device, sputtering was performed under conditions of film formation chamber internal pressure: 0.4 Pa, power density: 1.7 W/cm$^2$, and film formation roll temperature: 90° C. The thickness of the obtained copper oxide film was 20 nm.

Next, a copper film was formed on the surface of the interlayer insulating layer 7B where the copper oxide film was formed. Copper was used as a target, and while introducing argon gas (flow rate: 270 sccm) into a sputtering device, sputtering was performed under conditions of film formation chamber internal pressure: 0.4 Pa, power density: 4.2 W/cm$^2$, and film formation roll temperature: 90° C. In the laminate obtained as described above, the thickness of the copper film was 300 nm.

After forming the copper film, a rust preventing treatment was performed on the copper film, and the copper film was patterned using a photolithography method. More specifically, a positive tone resist was applied to the copper film to form a resist film having a thickness of 2 μm. Next, a glass photomask was prepared, the photomask including: a plurality of second electrodes 21 consisting of a regular mesh pattern MP2 having a line width of 1.5 μm where rhombuses having one side length of 600 μm and an acute angle of 65 degrees were continuous; a plurality of second pads 22 positioned at end parts of the plurality of second electrodes; a plurality of second peripheral wires 23 led out from the plurality of second pads 22; and a plurality of second external connection terminals 24 connected to the plurality of second peripheral wires. Next, the copper film was irradiated with light from a metal halide lamp in a state where the glass photomask was disposed on the resist film, and the laminate where the resist film was disposed was dipped in a sodium hydroxide aqueous solution having a concentration of 3% to be developed. As a result, the resist film having the pattern corresponding to the glass photomask was obtained. By using the resist film as a mask, the copper oxide film and the copper film were simultaneously etched using a ferric chloride (III) aqueous solution having a concentration of 5% to perform patterning. Finally, the remaining resist film was stripped, and the second conductive layer 6A having the mesh pattern MP2 formed of the fine metal wires MW2 having a thickness of 3 μm was obtained. As a result, a conductive member for a touch panel was formed.

The mesh pattern MP1 and the mesh pattern MP2 were disposed such that rhombus lattices were shifted by 300 μm and positions of intersections of diagonal lines of the rhombus lattice of the mesh pattern MP1 and positions of vertices of rhombuses of the mesh pattern MP2 matched with each other in the thickness direction.

(Bending Resistance Test Using Cylindrical Mandrel Method)

As a result of measuring the conductive member for a touch panel according to Example in the bending resistance test using the cylindrical mandrel method, the measured value of brittleness (the value of bend resistance) was 3 mm. More specifically, using a method according to JIS-K-5600-5-1 (1999), the obtained conductive member for a touch panel was wound around the cylindrical mandrel such that the interlayer insulating layer was positioned outside the flexible transparent insulating substrate, the bending test was performed, and whether or not breakage or peeling occurred in the interlayer insulating layer was observed. While sequentially reducing the diameter of the cylindrical mandrel around which the conductive member was wound at intervals of 1 mm, whether or breakage or peeling occurred in the bending test was observed, and the diameter of the mandrel where any one of breakage or peeling initially occurred was obtained as the measured value of brittleness.

Example 2

A conductive member for a touch panel according to Example 2 was prepared using the same method as that of Example 1, except that, in the step of forming the interlayer insulating layer 7B according to Example 1, the monomer M-1 was changed to the following monomer M-2 (acrylic equivalent: 254, CLogP: 14.1). The measured value of brittleness of the conductive member for a touch panel was 3 mm.

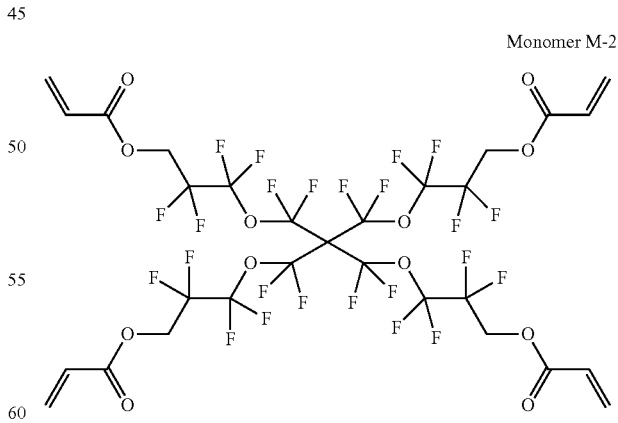

Monomer M-2

Example 3

A conductive member for a touch panel according to Example 3 was prepared using the same method as that of Example 1, except that, in the step of forming the interlayer insulating layer 7B according to Example 1, the monomer M-1 was changed to the following monomer M-3 (acrylic equivalent: 196, CLogP: 8.5). The measured value of brittleness of the conductive member for a touch panel was 4 mm.

Monomer M-3

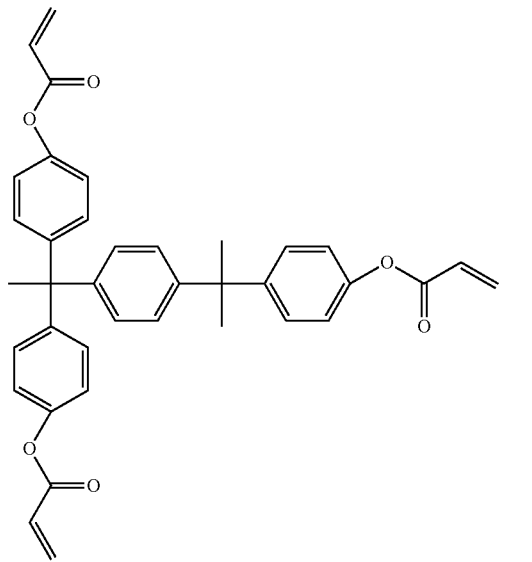

Example 4

A conductive member for a touch panel according to Example 4 was prepared using the same method as that of Example 1, except that, in the step of forming the interlayer insulating layer 7B according to Example 1, the monomer M-1 was changed to a monomer M-4 (EB-150, manufactured by Daicel-Allnex Ltd., acrylic equivalent: 256, CLogP: 6.7). The measured value of brittleness of the conductive member for a touch panel was 2 mm.

Example 5

A conductive member for a touch panel according to Example 5 was prepared using the same method as that of Example 1, except that, in the step of forming the interlayer insulating layer 7B according to Example 1, the monomer M-1 was changed to a monomer M-5 (KAYARAD PEG400DA, manufactured by Nippon Kayaku Co., Ltd., acrylic equivalent: 318, CLogP: 4.3). The measured value of brittleness of the conductive member for a touch panel was 3 mm.

Example 6

A conductive member for a touch panel according to Example 6 was prepared using the same method as that of Example 1, except that, the flexible transparent insulating substrate was changed to a PET film having a thickness of 5 μm. The measured value of brittleness of the conductive member for a touch panel was 2 mm.

Example 7

A conductive member for a touch panel according to Example 7 was prepared using the same method as that of Example 1, except that, the flexible transparent insulating substrate was changed to a PET film having a thickness of 10 μm. The measured value of brittleness of the conductive member for a touch panel was 2 mm.

Example 8

A conductive member for a touch panel according to Example 8 was prepared using the same method as that of Example 1, except that, the flexible transparent insulating substrate was changed to a PET film having a thickness of 60 μm. The measured value of brittleness of the conductive member for a touch panel was 4 mm.

Example 9

A conductive member for a touch panel according to Example 9 was prepared using the same method as that of Example 1, except that, in the step of forming the first conductive layer and the step of forming the second conductive layer, the thickness of the formed copper film was changed to 50 nm. The measured value of brittleness of the conductive member for a touch panel was 3 mm. In addition, both of the thickness of the fine metal wire MW1 of the mesh pattern MP1 in the first conductive layer and the thickness of the fine metal wire MW2 of the mesh pattern MP2 in the second conductive layer were 50 nm.

Example 10

A conductive member for a touch panel according to Example 10 was prepared using the same method as that of Example 1, except that, in the step of forming the first conductive layer and the step of forming the second conductive layer, the thickness of the formed copper film was changed to 100 nm. The measured value of brittleness of the conductive member for a touch panel was 3 mm. In addition, both of the thickness of the fine metal wire MW1 of the mesh pattern MP1 in the first conductive layer and the thickness of the fine metal wire MW2 of the mesh pattern MP2 in the second conductive layer were 100 nm.

Example 11

A conductive member for a touch panel according to Example 11 was prepared using the same method as that of Example 1, except that, in the step of forming the first conductive layer and the step of forming the second conductive layer, the thickness of the formed copper film was changed to 1000 nm. The measured value of brittleness of the conductive member for a touch panel was 4 mm. In addition, both of the thickness of the fine metal wire MW1 of the mesh pattern MP1 in the first conductive layer and the thickness of the fine metal wire MW2 of the mesh pattern MP2 in the second conductive layer were 1000 nm (1.0 m).

Example 12

A conductive member for a touch panel according to Example 12 was prepared using the same method as that of Example 1, except that, in the step of forming the first conductive layer and the step of forming the second conductive layer, the thickness of the formed copper film was changed to 1.5 μm. The measured value of brittleness of the conductive member for a touch panel was 4 mm. In addition, both of the thickness of the fine metal wire MW1 of the mesh pattern MP1 in the first conductive layer and the thickness of the fine metal wire MW2 of the mesh pattern MP2 in the second conductive layer were 1.5 μm.

Comparative Example 1

A conductive member for a touch panel according to Comparative Example 1 was prepared using the same method as that of Example 1, except that, in the step of forming the interlayer insulating layer according to Example 1, the thickness of the interlayer insulating layer to be formed was changed to 0.5 μm. The measured value of brittleness of the conductive member for a touch panel was 2 mm.

Comparative Example 2

A conductive member for a touch panel according to Comparative Example 2 was prepared using the same method as that of Example 1, except that, in the step of forming the interlayer insulating layer according to Example 1, the thickness of the interlayer insulating layer to be formed was changed to 6.0 μm. The measured value of brittleness of the conductive member for a touch panel was 10 mm.

[Evaluation]

For the conductive members for a touch panel according to Examples 1 to 12 and Comparative Examples 1 and 2 prepared as described above, the evaluations of insulating properties and conductivity described below were performed.

<Insulating Properties>

The first external connection terminal 14 of the first conductive layer 6B and the second external connection terminal 24 of the second conductive layer 6A were brought into contact with each other with a tester terminal to verify insulating properties. This insulation verification test was performed on all of combinations of the plurality of first external connection terminals and the plurality of second external connection terminals to evaluate the insulating properties of the conductive member for a touch panel based on the following evaluation standards. The evaluation B or A was determined as Pass.

A: insulating properties were secured in all of the combinations.

B: the proportion of combinations where insulating properties were secured was 95% or more and less than 100% with respect to all of the combinations.

C: the proportion of combinations where insulating properties were secured was less than 95% with respect to all of the combinations.

<Conductivity>

The second electrode 21 of the second conductive layer 6A and the second external connection terminal 24 connected to the second electrode 21 through the second peripheral wire 23 were brought into contact with each other with a tester to verify whether or not both of the components were electrically connected to each other. This verification test was performed on all of combinations of the plurality of second electrodes 21 and the plurality of second external connection terminals 24 corresponding thereto to evaluate the conductivity of the conductive member for a touch panel based on the following evaluation standards. The evaluation B or A was determined as Pass.

A: electrical conduction was verified in all of the combinations.

B: the proportion of combinations where electrical conduction was verified was 95% or more and less than 100% with respect to all of the combinations.

C: the proportion of combinations where electrical conduction was verified was less than 95% with respect to all of the combinations.

Regarding Examples 1 to 12 and Comparative Examples 1 and 2, the evaluation results of insulating properties and conductivity are shown in Table 1.

TABLE 1

| | Flexible Transparent Insulating Substrate | | First Conductive Layer/Second Conductive Layer | | Interlayer Insulating Layer | | | | | Evaluation | |
|---|---|---|---|---|---|---|---|---|---|---|---|
| | Thickness (μm) | Kind of Substrate | Material | Thickness (μm) | Monomer | Acrylic Equivalent | CLogP | Thickness (μm) | Brittleness (mm) | Insulating Properties | Conductivity |
| Example 1 | 50 | PET | Cu | 0.3 | M-1 | 273 | 8.0 | 3 | 3 | A | A |
| Example 2 | 50 | PET | Cu | 0.3 | M-2 | 254 | 14.1 | 3 | 3 | A | A |
| Example 3 | 50 | PET | Cu | 0.3 | M-3 | 196 | 8.5 | 3 | 4 | A | A |
| Example 4 | 50 | PET | Cu | 0.3 | M-4 | 256 | 6.7 | 3 | 2 | A | A |
| Example 5 | 50 | PET | Cu | 0.3 | M-5 | 318 | 4.3 | 3 | 3 | B | A |
| Example 6 | 5 | PET | Cu | 0.3 | M-1 | 273 | 8.0 | 3 | 2 | B | A |
| Example 7 | 10 | PET | Cu | 0.3 | M-1 | 273 | 8.0 | 3 | 2 | A | A |
| Example 8 | 60 | PET | Cu | 0.3 | M-1 | 273 | 8.0 | 3 | 4 | A | A |
| Example 9 | 50 | PET | Cu | 0.05 | M-1 | 273 | 8.0 | 3 | 3 | A | B |
| Example 10 | 50 | PET | Cu | 0.1 | M-1 | 273 | 8.0 | 3 | 3 | A | A |
| Example 11 | 50 | PET | Cu | 1 | M-1 | 273 | 8.0 | 3 | 4 | A | A |
| Example 12 | 50 | PET | Cu | 1.5 | M-1 | 273 | 8.0 | 3 | 4 | B | A |
| Comparative Example 1 | 50 | PET | Cu | 0.3 | M-1 | 273 | 8.0 | 0.5 | 2 | C | A |
| Comparative Example 2 | 50 | PET | Cu | 0.3 | M-1 | 273 | 8.0 | 6 | 10 | A | C |

Examples 1 to 12 satisfied the conditions where the thickness of the interlayer insulating layer was in a range of 1 to 5 μm and the measured value of brittleness of the conductive member for a touch panel was less than 5 mm. In the conductive members according to Examples 1 to 12 satisfying the conditions, excellent insulating properties and excellent conductivity are simultaneously achieved, and even in a case where the flexible film is used as the transparent insulating substrate, the touch panel can be prepared without damage of the conductive layer formed of the conductive material. Therefore, the manufacturing suitability is excellent.

In particular, in Examples where the CLogP value is 6.0 or more, the thickness of the flexible transparent insulating substrate was 10 μm or more, and the thickness of the fine metal wires MW1 and MW2 is 0.1 μm or more and 1.0 μm or less, both of insulating properties and conductivity are evaluated as Pass and are excellent.

On the other hand, in Comparative Example 1, the evaluation result of insulating properties is C, which is lower than that of Examples. The reason for this is presumed to be that the thickness of the interlayer insulating layer is small at 0.5 μm and interlayer insulating properties are insufficient.

In addition, in Comparative Example 2, the evaluation result of conductivity is C, which is lower than that of Examples. The reason for this is presumed to be that, in a case where the thickness of the interlayer insulating layer is excessively large, the brittleness of the conductive member deteriorates, and cracks are likely to be formed in the interlayer insulating layer such that the damage of the conductive layer cannon be prevented and the conductivity deteriorates.

Based on the above evaluation results, with the conductive member for a touch panel according to the embodiment of the present invention, it is possible to provide a method of manufacturing a conductive member for a touch panel and a conductive member for a touch panel, in which even in a case where a flexible substrate is used as a transparent insulating substrate, damage of the conductive layer can be prevented and interlayer insulating properties can be secured.

Examples 13 to 17

Conductive members for a touch panel according to Example 13 to 17 were prepared using the same method as that of Examples 1 to 5, respectively, except that: (1) the flexible transparent insulating substrate was changed to a PET film having a thickness of 40 m; (2) the glass photomask used in the step (step 1) of forming the first conductive layer was changed to form a section where a plurality of fine copper wires having a line width of 20 μm were arranged at intervals of 20 μm in the first peripheral wires 13; and (3) in the step (step 2) of forming the interlayer insulating layer, the thickness of the interlayer insulating layer to be formed was changed to 4.0 μm.

The measured values of brittleness of the conductive members for a touch panel are shown in Table 2 below.

Examples 18 to 20 and Comparative Examples 3 and 4

Conductive members for a touch panel according to Examples 18 to 20 and Comparative Examples 3 and 4 were prepared using the same method as that of Example 13, except that, in the step (step 2) of forming the interlayer insulating layer, the thickness of the interlayer insulating layer to be formed was changed to each of numerical values shown in Table 2.

The measured values of brittleness of the conductive members for a touch panel are shown in Table 2 below.

Comparative Example 5

A conductive member for a touch panel according to Comparative Example 5 was prepared using the same method as that of Example 13, except that, in the step (step 2) of forming the interlayer insulating layer, the monomer M-1 was changed to the following monomer M-6 (acrylic equivalent: 141, CLogP: 2.6). The measured value of brittleness of the conductive member for a touch panel was 7.0 mm.

Monomer M-6

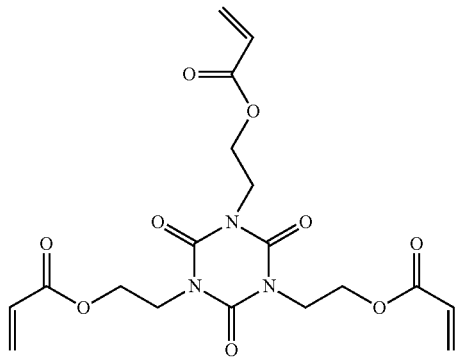

<Evaluation of Reliability (Storage stability)>

Regarding the conductive members for a touch panel according to Examples 13 to 20 and Comparative Examples 3 to 5 prepared as described above, the evaluation of reliability (storage stability) described below was performed.

In the first conductive layer, while applying a voltage of 4 V to two first peripheral wires 13 adjacent to each other, the conductive member according to each of the examples was stored for 12 days in a hygrothermal environment of 60° C. and 85%. After the storage period, a section of 500 μm where the fine copper wires were arranged was observed with an optical microscope. As a result, the state of the two fine copper wires (peripheral wires) was verified, and the sensory evaluation was performed by visual inspection based on the following evaluation standards.

(Evaluation Standards)
  6: bleeding, coloration, dendrite were not observed.
  5: bleeding, coloration, dendrite were not substantially observed.
  4: any one of weak bleeding, weak coloration, or small dendrite was observed.
  3: any one of stronger bleeding, stronger coloration, or larger dendrite compared to the evaluation result 4 was observed.
  2: any one of stronger bleeding, stronger coloration, or larger dendrite was observed.
  1: any one of stronger bleeding, stronger coloration, or larger dendrite compared to the evaluation result 2 was observed.

Among the evaluation results, the evaluation results 3 to 6 are levels where there are no problems in practice, in which the evaluation result 5 or 6 is preferable and the evaluation result 6 is most preferable.

Regarding Examples 13 to 20 and Comparative Examples 3 to 5, the evaluation results of reliability are shown in Table 2.

In the table, the column "Ratio Y/X" represents the ratio Y/X of the measured value Y (unit:mm) of brittleness of each of the conductive members to the thickness X (unit: μm) of the interlayer insulating layer.

TABLE 2

| | Flexible Transparent Insulating Substrate | | First Conductive Layer/Second Conductive Layer | | Interlayer Insulating Layer | | | | | | |
|---|---|---|---|---|---|---|---|---|---|---|---|
| | Thickness (μm) | Kind of Substrate | Material | Thickness (μm) | Monomer | Acrylic Equivalent | CLogP | Thickness (X) (μm) | Brittleness (Y) (mm) | Ratio Y/X | Reliability Evaluation |
| Example 13 | 40 | PET | Cu | 0.3 | M-1 | 273 | 8.0 | 4.0 | 3.0 | 0.75 | 5 |
| Example 14 | 40 | PET | Cu | 0.3 | M-2 | 254 | 14.1 | 4.0 | 3.0 | 0.75 | 5 |
| Example 15 | 40 | PET | Cu | 0.3 | M-3 | 196 | 8.5 | 4.0 | 3.0 | 0.75 | 5 |
| Example 16 | 40 | PET | Cu | 0.3 | M-4 | 256 | 6.7 | 4.0 | 2.0 | 0.50 | 6 |
| Example 17 | 40 | PET | Cu | 0.3 | M-5 | 318 | 4.3 | 4.0 | 3.0 | 0.75 | 5 |
| Example 18 | 40 | PET | Cu | 0.3 | M-1 | 273 | 8.0 | 3.0 | 3.0 | 1.00 | 4 |
| Example 19 | 40 | PET | Cu | 0.3 | M-1 | 273 | 8.0 | 2.0 | 2.0 | 1.00 | 4 |
| Example 20 | 40 | PET | Cu | 0.3 | M-1 | 273 | 8.0 | 0.7 | 1.0 | 1.43 | 4 |
| Comparative Example 3 | 40 | PET | Cu | 0.3 | M-1 | 273 | 8.0 | 0.25 | 1.0 | 4.00 | 1 |
| Comparative Example 4 | 40 | PET | Cu | 0.3 | M-1 | 273 | 8.0 | 6.0 | 10.0 | 1.67 | 2 |
| Comparative Example 5 | 40 | PET | Cu | 0.3 | M-6 | 141 | 2.6 | 4.0 | 7.0 | 1.75 | 2 |

All of Examples 13 to 20 satisfy the condition where the ratio Y/X of the measured value Y (mm) of brittleness of the conductive member for a touch panel to the thickness X (μm) of the interlayer insulating layer is 1.5 or less. It was verified that, in the conductive members according to Examples 13 to 20 satisfying the condition, even in a case where the conductive member for a touch panel is left to stand in a high temperature and high humidity environment, the storage stability is excellent.

On the other hand, in all of the conductive members according to Comparative Examples 3 to 5 where the ratio Y/X is more than 1.5, the evaluation result of reliability is 1 or 2, which is lower than that of Examples in the storage stability.

It is obvious from the evaluation results that, with the conductive member for a touch panel according to the embodiment of the present invention, a conductive member for a touch panel having excellent storage stability can be provided.

In addition, it was verified from a comparison between Examples 13 to 20 that, in a case where the ratio Y/X is less than 1.0, the storage stability is higher, and it was verified that, in a case where the ratio Y/X is 0.7 or less, the storage stability is much higher.

EXPLANATION OF REFERENCES

2: cover panel
3, 43: conductive member for touch panel
4: adhesive layer
41: touch panel
41A: front surface
41B: back surface
5: flexible transparent insulating substrate
5A, 5B: surface
6B: first conductive layer
6A: second conductive layer
7B: interlayer insulating layer
11: first electrode
12: first pad
13: first peripheral wire
14: first external connection terminal
21: second electrode
22: second pad
23: second peripheral wire
24: second external connection terminal
D1: first direction
D2: second direction
MC1: mesh cell
MP1: mesh pattern
MW1, MW2: fine metal wire
S1: transmission region
S2: peripheral region

What is claimed is:

1. A method of manufacturing a conductive member for a touch panel, the conductive member including a first conductive layer, an interlayer insulating layer, and a second conductive layer in this order on a flexible transparent insulating substrate, and the method comprising:
   a step 1 of forming the first conductive layer on the flexible transparent insulating substrate;
   a step 2 of forming the interlayer insulating layer on the first conductive layer; and
   a step 3 of forming the second conductive layer on the interlayer insulating layer,
   wherein each of the step 1 and the step 3 includes a step of forming a fine metal wire using a photolithography method,
   a thickness of the interlayer insulating layer is 1 to 5 μm,
   a value of bend resistance obtained by measuring the conductive member for a touch panel in a bending resistance test using a cylindrical mandrel method according to JIS-K5600-5-1 is less than 5 mm,
   the interlayer insulating layer includes a polymer derived from at least one compound selected from the group consisting of a monomer and an oligomer having at least one of an acryloyl group or a methacryloyl group, and
   a CLogP value of the compound is 6.0 or more.

2. The method of manufacturing a conductive member for a touch panel according to claim 1,
   wherein
   an acrylic equivalent of the compound is 180 or more.

3. The method of manufacturing a conductive member for a touch panel according to claim 1,
   wherein each of the first conductive layer and the second conductive layer includes a fine metal wire having a thickness of 0.1 to 1 μm, and
   the fine metal wire includes copper.

4. The method of manufacturing a conductive member for a touch panel according to claim 1,
wherein the flexible transparent insulating substrate is a substrate formed of a polyester polymer, and
a thickness of the flexible transparent insulating substrate is 10 to 60 μm.

5. A conductive member for a touch panel, the conductive member comprising a first mesh conductive layer, an interlayer insulating layer, and a second mesh conductive layer in this order on a flexible transparent insulating substrate,
wherein a thickness of the interlayer insulating layer is 1 to 5 μm,
a value of bend resistance obtained by measuring the conductive member for a touch panel in a bending resistance test using a cylindrical mandrel method according to JIS-K5600-5-1 is less than 5 mm,
the interlayer insulating layer includes a polymer derived from at least one compound selected from the group consisting of a monomer and an oligomer having at least one of an acryloyl group or a methacryloyl group, and
a CLogP value of the compound is 6.0 or more.

6. A conductive member for a touch panel, the conductive member comprising a first mesh conductive layer, an interlayer insulating layer, and a second mesh conductive layer in this order on a flexible transparent insulating substrate,
wherein in a case where a thickness (m) of the interlayer insulating layer is represented by X and a value (mm) of bend resistance obtained by measuring the conductive member for a touch panel in a bending resistance test using a cylindrical mandrel method according to JIS-K5600-5-1 is represented by Y, Y/X is 1.5 or less,
the interlayer insulating layer includes a polymer derived from at least one compound selected from the group consisting of a monomer and an oligomer having at least one of an acryloyl group or a methacryloyl group, and
a CLogP value of the compound is 6.0 or more.

7. The conductive member for a touch panel according to claim 6,
wherein
an acrylic equivalent of the compound is 180 or more.

8. The conductive member for a touch panel according to claim 6,
wherein each of the first mesh conductive layer and the second mesh conductive layer includes a fine metal wire having a thickness of 0.1 to 1 μm, and
the fine metal wire includes copper.

9. The conductive member for a touch panel according to claim 6,
wherein the flexible transparent insulating substrate is a substrate formed of a polyester polymer, and
a thickness of the flexible transparent insulating substrate is 10 to 60 μm.

* * * * *